United States Patent [19]

Shindo et al.

[11] Patent Number: 5,154,949
[45] Date of Patent: Oct. 13, 1992

[54] PROCESS FOR FORMING METAL DEPOSITED FILM CONTAINING ALUMINUM AS MAIN COMPONENT BY USE OF ALKYL ALUMINUM HYDRIDE

[75] Inventors: Hitoshi Shindo; Takeshi Ichikawa, both of Atsugi; Osamu Ikeda, Yokohama; Kazuaki Ohmi, Hadano; Shigeyuki Matsumoto, Atsugi, all of Japan

[73] Assignee: Canon Kabushiki Kaisha, Tokyo, Japan

[21] Appl. No.: 841,307

[22] Filed: Feb. 28, 1992

Related U.S. Application Data

[63] Continuation-in-part of Ser. No. 765,469, Sep. 26, 1991, abandoned, which is a continuation of Ser. No. 588,287, Sep. 26, 1990, abandoned.

[30] Foreign Application Priority Data

| | | | |
|---|---|---|---|
| Sep. 26, 1989 | [JP] | Japan | 1-250011 |
| Sep. 26, 1989 | [JP] | Japan | 1-250012 |
| Sep. 26, 1989 | [JP] | Japan | 1-250013 |
| Sep. 26, 1989 | [JP] | Japan | 1-250014 |

[51] Int. Cl.$^5$ .................................................. C23C 16/00
[52] U.S. Cl. .................................. 427/253; 427/252; 427/255.2; 427/264; 427/265; 427/270; 427/271; 437/51; 437/228; 437/235; 437/243; 437/245
[58] Field of Search ............ 427/253, 252, 255.2, 427/264, 265, 270, 271; 437/51, 228, 235, 243, 245

[56] References Cited

FOREIGN PATENT DOCUMENTS

| | | |
|---|---|---|
| 63-33569 | 2/1988 | Japan . |
| 1-252776 | 10/1989 | Japan . |
| 2-170419 | 7/1990 | Japan . |
| 2-185026 | 7/1990 | Japan . |

OTHER PUBLICATIONS

R. A. Levy et al., "Characterization of LPCVD Aluminum for VLSI Processing", Journal of the Electrochemical Society, vol. 131, No. 9, pp. 2175-2182, Sep. 1984.

R. Bhat et al., "The Growth and Characterization of AlGaAs Using Dimethyl Aluminum Hydride", Journal of Crystal Growth, vol. 77, pp. 7-10 (1986).

M. Hanabusa et al., "Photochemical Vapor Deposition of Aluminum Thin Films Using Dimethylaluminum Hydride", Japanese Journal of Applied Physics, vol. 27, No. 8, L1392-L1394, Aug. 1988.

A. Sekiguchi et al., "Gas-Temperature-Controlled (GTC) CVD of Aluminum and Aluminum-Silicon Alloy Film for VLSI Processing", Japanese Journal of Applied Physics, vol. 27, No. 11, pp. L2134-L2136, Nov. 1988.

*Primary Examiner*—Bernard Pianalto
*Attorney, Agent, or Firm*—Fitzpatrick, Cella, Harper & Scinto

[57] ABSTRACT

A process for forming an additive-containing Al film of good quality according to the CVD method utilizing an alkyl aluminum hydride, a gas containing an additive and hydrogen, which is an excellent deposited film formation process also capable of selective deposition of additive-containing Al.

48 Claims, 5 Drawing Sheets

PROCESS FOR FORMING METAL DEPOSITED FILM CONTAINING ALUMINUM AS MAIN COMPONENT BY USE OF ALKYL ALUMINUM HYDRIDE

This application is a continuation-in-part of application Ser. No. 07/765,469, filed Sep. 26, 1991, now abandoned, which is a continuation of application Ser. No. 07/588,287, filed Sep. 26, 1990, now abandoned.

BACKGROUND OF THE INVENTION

1. Field of the invention

This invention relates to a process for forming a deposited film, particularly a process for forming a deposited film composed mainly of Al and containing additives such as Ti, Cu, etc. which can be preferably applied to electrodes or wiring of a semiconductor integrated circuit device, etc.

2. Related background art

In the prior art, in electronic devices or integrated circuits by use of semiconductors, for electrodes and wiring, aluminum (Al) or a metal containing aluminum as main component such as Al-Si and the like has been primarily used. Al has many advantages such that it is inexpensive and high in electroconductivity, that it can be also internally chemically protected because a dense oxidized film can be formed on the surface, and that it has good adhesion to Si, etc.

As the method for forming a film for electrodes and wiring of Al or Al-Si as mentioned above, there has been used in the prior art the sputtering method such as magnetron sputtering, etc.

However, selective deposition and selective growth can not be realized by the sputtering method which has been used in the prior art. The sputtering is the physical deposition method based on flying of sputtered particles in vacuum, the film thickness at the stepped portion or the insulating film side wall becomes extremely thin, leading to wire breaking in an extreme case. Nonuniformity of film thickness or wire breaking has the drawback that reliability of LSI is markedly lowered.

On the other hand, since the integration degree of the integrated circuit such as LSI, etc. is increased, and fine formation of wiring or multi-layer wiring has been particularly required in recent years, there is an increasing severe demand not found to date for Al or Al-Si wiring of the prior art. With finer dimensional formation by increased integration degree, the surface of LSI, etc. is subject to excessive unevenness due to oxidation, diffusion, thin film deposition, and etching, etc. For example, electrodes or wiring metal must be deposited on the surface with a stepped difference, or deposited in a via-hole which is fine in diameter and deep. In 4 Mbit or 16 Mbit DRAM (dynamic RAM), etc., the aspect ratio (via-hole depth/via-hole diameter) of via-hole in which a metal composed mainly of Al such as Al-Si, etc. is to be deposited is 1.0 or more, and the via-hole diameter itself also becomes 1 $\mu$m or less. Therefore, even for a via-hole with large aspect ratio, the technique which can deposit an Al-Si compound is required.

Particularly, for performing sure electrical connection to the device under insulating film such as $SiO_2$, etc., rather than film formation, Al-Si is required to be deposited so as to embed only the via-hole of the device. In such case, a method of depositing an Al alloy only on Si or metal surface and not depositing it on an insulating film such as $SiO_2$, etc. is required.

As the improved sputtering method, there has been developed the bias sputtering method in which a bias is applied on a substrate and deposition is performed so as to embed Al or an Al-Si compound only in the via-hole by utilizing the sputter etching action and the deposition action on the substrate surface. However, since the bias voltage of some 100 V or higher is applied on the substrate, deleterious influence on the device occurs because of charged particle damaging such as change in threshold of MOS-FET, etc. Also, because of presence of both etching action and deposition action, there is the problem that the deposition speed cannot be essentially improved.

In order to solve the problems as described above, various types of CVD (Chemical Vapor Deposition) methods have been proposed. In these methods, chemical reaction of the starting gas in some form is utilized. In plasma CVD or optical CVD, decomposition of the starting gas occurs in gas phase, and the active species formed there further reacts on the substrate to give rise to film formation. In these CVD methods, surface coverage on unevenness on the substrate surface is good. However, carbon atoms contained in the starting gas molecule are incorporated into the film. Also, particularly in plasma CVD, the problem remained that there was damage by charged particles (so called plasma damage) as in the case of the sputtering method.

The thermal CVD method, in which the film grows through the surface reaction primarily on the substrate surface, is good in surface coverage on unevenness such as stepped portion of the surface, etc. Also, it can be expected that deposition within via-hole will readily occur. Further, wire breaking at the stepped portion can be avoided. Furthermore, there are not caused damages by charged particles which have been observed in the case of the plasma CVD or the sputtering method. The methods of such a kind include, for example, the method seen in Journal of Electrochemical Society, Vol. 131, p. 2175 (1984). In this method triisobutyl aluminum (i-$C_4H_9$)$_3$Al (TIBA) is used as organic aluminum gas and an Al film is formed at a film formation temperature of 260° C. and a reaction tube pressure of 0.5 Torr. The substrate temperature is then maintained at about 450° C. and $SiH_4$ is introduced to diffuse Si in the Al film, thus obtaining an Al-Si film.

When TIBA is to be used, a continuous film can not be obtained unless pretreatment is effected in which prior to film formation, $TiCl_4$ is flowed to activate the substrate surface to form nuclei. Furthermore, in case where TIBA is used, there is a problem that surface flatness is not sufficient even when $TiCl_4$ is used. By this method it is not possible to effect selective growth such as Al-Si deposition only in via-holes.

As another method, there can be mentioned the method described in Japanese Journal of Applied Physics, Vol. 27, No. 11, p. L2134 (1988). In this method, TIBA and $Si_2H_6$ diluted with Ar gas are supplied, and the gases are heated before TIBA reaches the substrate. By this method, an Al-Si film of a low resistivity can be epitaxially grown on a Si(100) wafer. Although the film obtained by this method has good high quality, there are involved the problems that control is difficult due to necessity of heating the gases and that apparatus for effecting this method is complicated.

Japanese Laid-Open Patent Application No. 63-33569 describes a method of forming a film by using no $TiCl_4$, but using in place thereof organic aluminum and heating it in the vicinity of the substrate. According to this method. Al can be deposited selectively only on the metal or semiconductor surface from which the naturally oxidized film has been removed.

In this case, it is clearly stated that the step of removing the naturally oxidized film on the substrate surface is necessary before introduction of TIBA. Also, it is described that, since TIBA can be used alone, no carrier gas is required to be used, but Ar gas may be also used as the carrier gas. However, the reaction of TIBA with another gas (e.g. $H_2$) is not contemplated at all, and there is no description of use of $H_2$ as the carrier gas. Also, in addition to TIBA, trimethyl aluminum (TMA) and triethyl aluminum (TEA) are mentioned, but there is no specific description of other organic metals. This is because, since the chemical properties of organic metals generally vary greatly if the organic substituent attached to the metal element varies little, it is necessary to investigate individually by detailed experimentation to determine what organic metal should be used.

In the CVD method as described above, not only is there an inconvenience in that the naturally oxidized film must be removed, but also there is the drawback that no surface smoothness can be obtained. Also, there is the restriction that heating of the gas is necessary, and yet heating must be done in the vicinity of the substrate. Besides, it must also be experimentally determined at what proximity to the substrate heating must be done, whereby there is also the problem that the place for setting the heater cannot be necessarily freely chosen.

In the pre-text of the 2nd Symposium of Electrochemical Society, Branch of Japan (Jul. 7, 1989), on page 75, there is a description of film formation of Al according to the double wall CVD method. In this method, TIBA is used and the device is designed so that the gas temperature of TBA can be made higher than the substrate temperature. This method may be also regarded as a modification of the above-mentioned Japanese Laid-open Patent Application No. 63-33569. Also in this method, Al can be selectively grown only on a metal or semiconductor, but not only the difference between the gas temperature and the substrate surface temperature can be controlled with difficulty, but also there is the drawback that the bomb and the pipeline must be heated. Moreover, according to this method, there are involved such problems that no uniform continuous film can be formed, that flatness of the film is poor, etc., unless the film is made thick to some extent.

As set forth above, the prior art methods have the problems to be solved that it is difficult to obtain a flat Al-Si film of a low resistivity and good quality, that there is considerable limitation in apparatus and in film formation.

As described above, prior art methods cannot necessarily effect well selective growth of Al-Si, and even if possible, there is a problem with respect to flatness, resistance, purity, etc. of the Al film formed. Also, there has been involved the problem that the film formation method is complicated and is difficult to control.

Accordingly, the present inventors, in order to investigate about the wiring material itself, have made investigations by forming a deposited film of Al-Ti, Al-Cu or Al-Si-Cu according to the sputtering method by use of Al-Ti, Al-Cu or Al-Si-Cu as the target.

However, no film of good quality satisfying the requirements as described above in flatness, denseness, selectivity superior over Al could be obtained in the method of the prior art.

SUMMARY OF THE INVENTION

As described above, in the technical field of semiconductors in which higher integration has been desired in recent years, for providing inexpensively a semiconductor device which is more highly integrated and also made higher in performances, there remained many areas to be improved.

The present invention has been accomplished in view of the technical tasks as described above, and an object of the present invention is to provide a process for forming a deposited film composed mainly of Al and containing an additive which can form a film of good quality as the electroconductive material at a desired position with good controllability.

Another object of the present invention is to provide a process for forming a deposited film composed mainly of Al and containing an additive which can obtain a film which has extremely broad general purpose utility and yet is of good quality, without requiring particularly no complicated and expensive deposited film forming apparatus.

Still another object of the present invention is to provide a process for forming a deposited film composed mainly of Al and containing an additive which can form a film excellent in surface characteristic, electrical characteristics, purity, etc. according to the CVD method utilizing alkyl aluminum hydride, hydrogen, and a gas containing at least one additive element selected from Ti and Cu.

Still another object of the present invention is to provide a process for forming a deposited film composed mainly of Al and containing an additive which is extremely broad in general purpose utility and excellent in selectivity, without specifically requiring a complicated and expensive deposited film forming apparatus.

Still another object of the present invention is to provide a process for forming a deposited film which can form an Al-Si film under good selectivity according to the CVD method utilizing alkyl aluminum hydride, hydrogen and a gas containing at least one additive element selected from Ti and Cu.

Another object of the present invention is to form a deposited film excellent in flatness, denseness, and also strong in electromigration, and stress migration.

Another object of the present invention is to form a deposited film sufficiently applicable to a semiconductor integrated circuit device in which wiring of, for example, 1.0 μm or less is desired.

Another object of the present invention is to provide a process for forming a deposited film comprising the steps of:

(a) providing a substrate having an electron donative surface (A) and a electron non-donative surface (B) in a space for formation of the deposited film;

(b) introducing a gas of an alkyl aluminum hydride, a gas containing titanium atoms and hydrogen gas into the space for formation of the deposited film; and (c) maintaining the temperature of the electron donative surface (A) at a temperature not lower than the decomposition temperature of the alkyl aluminum hydride and not higher than 450° C. to form an aluminum film containing titanium selectively on the electron donative surface (A).

Another object of the present invention is to provide a process for forming a deposited film comprising the steps of:

(a) providing a substrate having an electron donative surface (A) and a electron non-donative surface (B) in a space for formation of the deposited film;

(b) introducing a gas of an alkyl aluminum hydride, a gas containing titanium atoms, a gas containing silicon atoms and hydrogen gas into the space for formation of the deposited film; and (c) maintaining the temperature of the electron donative surface (A) at a temperature not lower than the decomposition temperature of the alkyl aluminum hydride and not higher than 450° C. to form an aluminum film containing titanium and silicon selectively on the electron donative surface (A).

Another object of the present invention is to provide a process for forming a deposited film comprising the steps of:

(a) providing a substrate having an electron donative surface in a space for formation of the deposited film;

(b) introducing a gas of an alkyl aluminum hydride, a gas containing titanium atoms and hydrogen gas into the space for formation of the deposited film; and (c) maintaining the temperature of the electron donative surface at a temperature not lower than the decomposition temperature of the alkyl aluminum hydride and not higher than 450° C. to form an aluminum film containing titanium on the electron donative surface.

Another object of the present invention is to provide a process for forming a deposited film comprising the steps of:

(a) providing a substrate having an electron donative surface in a space for formation of the deposited film;

(b) introducing a gas of an alkyl aluminum hydride, a gas containing silicon atoms, a gas containing titanium atoms and hydrogen gas into the space for formation of the deposited film; and (c) maintaining the temperature of the electron donative surface at a temperature not lower than the decomposition temperature of the alkyl aluminum hydride and not higher than 450° C. to form an aluminum film containing silicon and titanium on the electron donative surface.

Another object of the present invention is to provide a process for forming a deposited film comprising the steps of:

(a) providing a substrate having an electron donative surface in a space for formation of the deposited film;

(b) introducing a gas of an alkyl aluminum hydride, a gas containing Cu and hydrogen gas into the space for formation of the deposited film; and (c) maintaining the temperature of the electron donative surface at a temperature not lower than the decomposition temperature of the alkyl aluminum hydride and not higher than 450° C. to form an aluminum film on the electron donative surface.

Another object of the present invention is to provide a process for forming a deposited film comprising the steps of:

(a) providing a substrate having an electron donative surface in a space for formation of the deposited film;

(b) introducing a gas of an alkyl aluminum hydride, a gas containing Si, a gas containing Cu and hydrogen gas into the space for formation of the deposited film; and (c) maintaining the temperature of the electron donative surface at a temperature not lower than the decomposition temperature of the alkyl aluminum hydride and not higher than 450° C. to form an aluminum film on the electron donative surface.

Another object of the present invention is to provide a process for forming a deposited film comprising the steps of:

(a) providing a substrate having an electron donative surface (A) and a electron non-donative surface (B) in a space for formation of the deposited film;

(b) introducing a gas of an alkyl aluminum hydride, a gas containing copper atoms and hydrogen gas into the space for formation of the deposited film; and (c) maintaining the temperature of the electron donative surface (A) at a temperature not lower than the decomposition temperature of the alkyl aluminum hydride and not higher than 450° C. to form an aluminum film selectively on the electron donative surface (A).

Another object of the present invention is to provide a process for forming a deposited film comprising the steps of:

(a) providing a substrate having an electron donative surface (A) and a electron non-donative surface (B) in a space for formation o the deposited film;

(b) introducing a gas of an alkyl aluminum hydride, a gas containing Si and a gas containing copper atoms and hydrogen gas into the space for formation of the deposited film; and (c) maintaining the temperature of the electron donative surface (A) at a temperature not lower than the decomposition temperature of the alkyl aluminum hydride and not higher than 450° C. to form an aluminum film selectively on the electron donative surface (A).

DETAILED DESCRIPTION OF THE PREFERRED EMBODIMENTS

Figure 1:
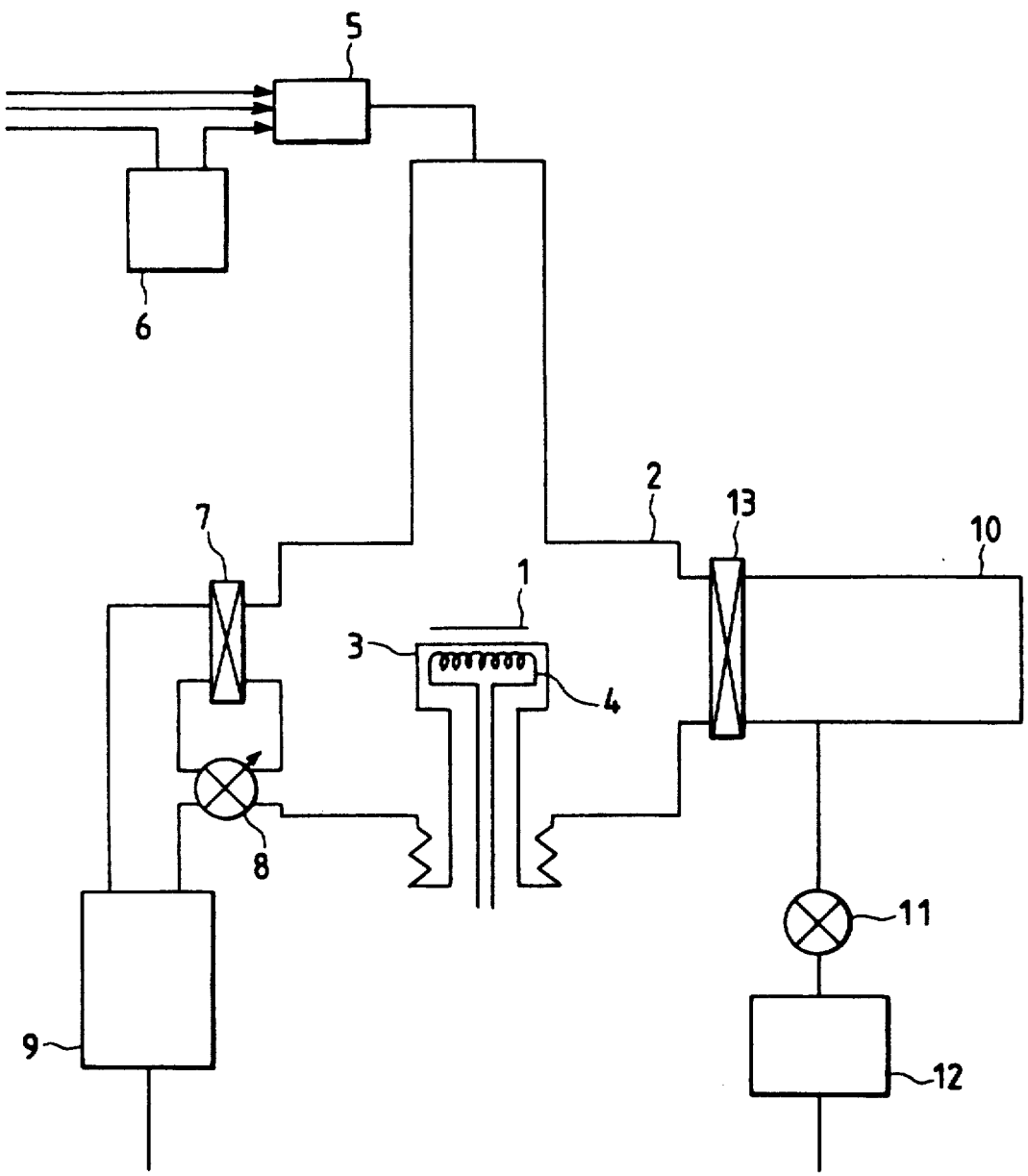
FIG. 1 is a schematic view for illustration of a suitable deposited film forming apparatus in practicing the deposited film forming process according to the process of the present invention.

Preferred embodiments according to the present invention are described in detail below, but the present invention is not limited by these embodiments, and it may have a constitution which accomplishes the object of the present invention.

One preferred embodiment of the present invention is a process for forming a deposited film comprising the steps of:

(a) providing a substrate having an electron donative surface (A) in a space for formation of the deposited film;

(b) introducing a gas of an alkyl aluminum hydride, a gas containing an additive such as Ti, Cu, etc. and hydrogen gas into the space for formation of the deposited film; and (c) maintaining the temperature of the electron donative surface (A) within the range of from the decomposition temperature of the alkyl aluminum hydride to 450° C. to form an aluminum film containing the additive such as Ti, Cu, etc. on the electron donative surface (A).

It is also preferred to additionally use a gas containing Si atoms to thereby form an Al film containing Si atoms and the additive such as Al-Si-Ti, Al-Si-Cu and the like.

Further, another preferred embodiment of the present invention is a process for forming a deposited film comprising the steps of:

(a) providing a substrate having an electron donative surface (A) and a electron non-donative surface (B) in a space for formation of the deposited film;

(b) introducing a gas of an alkyl aluminum hydride, a gas containing an additive such as Ti, Cu, etc. and hydrogen gas into the space for formation of the deposited film; and (c) maintaining the temperature of the electron donative surface (A) within the range of from the decomposition temperature of the alkyl aluminum hydride to 450° C. to form aluminum film containing the additive such as Ti, Cu, etc. selectively on the electron donative surface (A).

It is also preferred to additionally use a gas containing Si atoms to thereby form an Al film containing Si atoms and the additive such as Al-Si-Ti, Al-Si-Cu and the like.

In the following, prior to detailed description, first, the process for forming a deposited film by use of an organic metal is outlined.

The decomposition reaction of an organic metal, and hence the thin film deposition reaction will vary greatly depending on the kind of the metal atom, the kind of the alkyl bonded to the metal atom, the means of causing the decomposition reaction to occur, the atmospheric gas, etc.

For example, in the case of M-R₃ (M: the group III metal, R: alkyl group), trimethyl gallium:

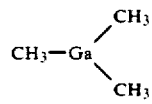

in thermal decomposition undergoes radical cleavage wherein Ga—CH₃ bond is cleaved, while triethyl gallium:

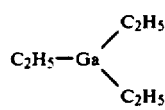

in thermal decomposition is decomposed through β-elimination into:

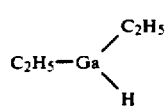

and C₂H₄. On the other hand, triethyl aluminum attached with the same ethyl group:

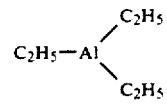

in thermal decomposition undergoes radical decomposition in which Al—C₂H₅ is cleaved. However, tri-isobutyl aluminum having iC₄H₉ bonded therein:

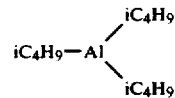

is subject to β-elimination.

Trimethyl aluminum (TMA) comprising CH₃ groups and Al has a dimer structure at room temperature:

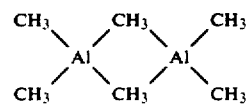

and thermal decomposition is radical decomposition in which Al—CH₃ group is cleaved, and at a temperature of 150° C. or lower, it reacts with atmospheric H₂ to form CH₄, and forms finally Al.

However, at a high temperature of 300° C. or higher, even if H₂ may be present in the atmosphere, CH₃ group will withdraw H from the TMA molecule, until finally Al-C compound is formed.

Also, in the case of TMA, in light or a certain region controlled in electric power in H₂ atmosphere high frequency (ca. 13.56 MHz) plasma, C₂H₆ will be formed by the bridging CH₃ between two Al's.

In essence, since even an organic metal comprising CH₃ group which the simplest alkyl group, C₂H₅ group or iC₄H₉ and Al or Ga has a reaction mode depending on the kind of the alkyl group, the kind of the metal atom, the excitation decomposition means, for deposition of a metal atom from an organic metal on a desired substrate, the decomposition reaction must be strictly controlled. For example, when Al is to be deposited from triisobutyl aluminum:

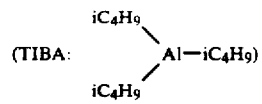

in the low pressure CVD method comprising mainly thermal reaction, unevenness of μm order is formed on the surface, whereby the surface morphology is inferior. Also, hillock generation by heat treatment, Si surface roughening through Si diffusion at the interface between Al and Si occur, and also migration resistance is inferior, thereby making it difficult to utilize ultra-LSI process.

For this reason, a method for controlling precisely both the gas temperature and the substrate temperature has been attempted. However, the device is complicated, and the method is of the sheet treatment type in which deposition can be effected only on one wafer by one deposition process. Besides, since the deposition speed is 500 Å/min. at the highest, the throughput necessary for bulk production cannot be realized.

Similarly, when TMA is employed, Al deposition has been attempted by use of plasma or light, the device also becomes complicated due to use of plasma or light, and also because of the sheet type device, there remains room for improvement for sufficient improvement of throughput.

Dimethyl aluminum hydride (DMAH) as the alkyl aluminum hydride to be utilized in the present invention is a substance known as alkyl metal, but it could not be estimated at all what Al thin film could be deposited depending on what reaction mode, unless deposited films are formed under all the conditions. For example, in an example of deposition Al by optical CVD from DMAH, the surface morphology is inferior, and the resistivity value was greater than the bulk value (2.7 $\mu$ohm·cm) as several $\mu$ohm to 10 $\mu$ohm cm, thus being inferior in film quality.

Now, referring to the drawings, preferred embodiments of the present invention are described in more detail.

In the present invention, for depositing an Al-Si film of good quality as the electroconductive deposition film on a substrate, the CVD method is used.

More specifically, by use of dimethyl aluminum hydride (DMAH):

Chemical formula:

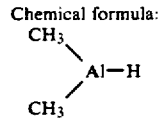

or monomethyl aluminum hydride (MMAH$_2$):

Chemical formula:

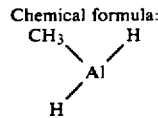

as alkyl aluminum hydride which is an organic metal as the starting gas containing at least one atom which becomes the constituent of the deposited film, a gas containing an additive as the starting gas and H$_2$ as the reaction gas, an Al film is formed by gas phase growth with a gas mixture of these on a substrate.

Furthermore, if desired, a gas containing Si atoms may be added.

As the substrate applicable in the present invention, a material having electron donative property may be employed.

The electron donative material is described in detail below.

The electron donative material refers to one having free electrons existing or free electrons intentionally formed in the substrate, for example, a material having a surface on which the chemical reaction is promoted through give-and-take of electrons with the starting gas molecules attached on the substrate surface. For example, generally metals and semiconductors such as p-, n- and i-type ones correspond to such material. Those having very thin oxidized film on the metal or semiconductor surface are also included. For, with such thin film, the chemical reaction can occur between the substrate and the attached starting molecules.

Specifically, there may be included semiconductors such as single crystalline silicon, polycrystalline silicon, amorphous silicon, etc., binary system or ternary system or quarternary system III-V compound semiconductors comprising combinations of Ga, In, Al as the group III element and P, As, N as the group V element, or II-IV compound semiconducters, or metals themselves such as tungsten, molybdenum, tantalum, aluminum, titanium, copper, etc., or silicides of the above metals such as tungsten silicide, molybdenum silicide, tantalum silicide, aluminum silicide, titanium silicide, etc., further metals containing either one of the constituent of the above metals such as aluminum silicon, aluminum titanium, aluminum copper, aluminum tantalum, aluminum silicon copper, aluminum silicon titanium, aluminum palladium, titanium nitride, etc.

On the substrate with such constitution, Al is deposited only through simple thermal reaction in the reaction system of the starting gas and H$_2$. For example, the thermal reaction in the reaction system between DMAH and H$_2$ may be basically considered as follows:

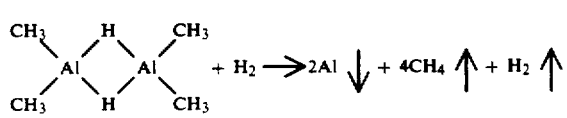

DMAH assumes a dimer structure at room temperature. Also, with MMAH$_2$, a high quality Al film could be formed by thermal reaction as shown below in Examples.

Formation of Al-Ti (or Al-Si-Ti) by addition of TiCl$_4$ (or additionally Si$_2$H$_6$) is due to the phenomenon that TiCl$_4$ (or additionally Si$_2$H$_6$) which has reached the substrate surface is decomposed through the surface chemical reaction, thereby incorporating Ti (or additionally Si) into the film. Also with MMAH$_2$, Al-Ti of high quality (or Al-Si-Ti) could be deposited by thermal reaction as shown below in Examples.

Also, formation of Al-Si-Cu or Al-Cu by addition of Si$_2$H$_6$, etc. and an alkyl copper compound such as Cu(C$_5$H$_7$O$_2$)$_2$, etc. is due to the phenomenon that Si$_2$H$_6$ and Cu(C$_5$H$_7$O$_2$)$_2$ which have reached the substrate surface are decomposed through the surface chemical reaction, whereby Si and Cu are incorporated into the film. Also with MMAH$_2$, Al-Cu and Al-Si-Cu of high quality could be deposited by thermal reaction as shown below in Examples.

Since MMAH$_2$ has low vapor pressure as 0.01 to 0.1 Torr at room temperature, a large amount of the starting material can be transported with difficulty, and the upper limit value of the deposition speed is several hundred Å/min. in the present embodiment, and preferably, it is most desirable to use DMAH of which vapor pressure is 1 Torr at room temperature.

In another embodiment of the present invention, the CVD method is used for selective deposition of a good Al film as the electroconductive deposition film on the substrate.

More specifically, as described above, by use of dimethyl aluminum hydride (DMAH) or monomethyl aluminum hydride (MMAH$_2$), a gas containing Si atoms as the starting gas and H$_2$ as the reaction gas, an Al-Si film is selectively formed on the substrate by gas phase growth with a gas mixture of these.

The substrate applicable in the present invention has a first substrate surface material for formation of the surface on which Al containing an additive is deposited, and a second substrate surface material on which Al containing an additive is not deposited. And, as the first substrate surface material, a material having the electron donative surface is used.

In contrast, as the material for forming the surface on which Al containing an additive is not deposited selectively, namely the material for forming the electron non-donative surface, conventional insulating materials, oxidized silicon formed by thermal oxidation, CVD, etc., glass or oxidized film such as BSG, PSG, BPSG, etc., thermally nitrided film, silicon nitrided film by plasma CVD, low pressure CVD, ECR-CVD method, etc.

FIG. 1 is a schematic view showing a preferable deposition film forming device for applying the present invention.

Here, 1 is a substrate for forming an additive-containing Al film. The substrate 1 is mounted on a substrate holder 3 provided internally of the reaction tube 2 for forming a space for formation of a deposited film which is substantially closed to FIG. 1. As the material constituting the reaction tube 2, quartz is preferable, but it may be also made of a metal. In this case, it is preferable to cool the reaction tube. The substrate holder 3 is made of a metal, and is provided with a heater 4 so that the substrate mounted thereon can be heated. And, the constitution is made so that the substrate temperature can be controlled by controlling the heat generation temperature of the heater 4.

The feeding system of gases is constituted as described below.

5 is a gas mixer, in which the first starting gas, the second starting gas and the reaction gas are mixed, and the mixture is fed into the reaction tube 2. 6 is a starting gas gasifier provided for gasification of an organic metal as the first starting gas.

The organic metal to be used in the present invention is liquid at room temperature, and is formed into saturated vapor by passing a carrier gas through the liquid of the organic metal within the gasifier 6, which is in turn introduced into the mixer 5.

The evacuation is constituted as described below.

7 is a gate valve, which is opened when performing evacuation of a large volume such as during evacuation internally of the reaction tube 2 before formation of the deposited film. 8 is a slow leak valve, which is used when performing evacuation of a small volume such as in controlling the pressure internally of the reaction tube 2 during formation of the deposited film. 9 is an evacuation unit, which is constituted of a pump for evacuation such as turbo molecular pump, etc.

The conveying system of the substrate 1 is constituted as described below.

10 is a substrate conveying chamber which can house the substrate before and after formation of the deposited film, which is evacuated by opening the valve 11. 12 is an evacuation unit for evacuating the conveying chamber, which is constituted of a pump for evacuation such as turbo molecular pump, etc.

The valve 13 is opened only when the substrate 1 is transferred between the reaction chamber and the conveying space.

As shown in FIG. 1, in the starting gas gasifier 6 which is the gas formation chamber for forming the starting gas, the liquid DMAH maintained at room temperature is bubbled with $H_2$ or Ar (or other inert gas) as the carrier gas to form gaseous DMAH, which is transported to the mixer 5. The $H_2$ gas as the reaction gas is transported through another route into the mixer 5. Similarly, a gas containing an additive such as Ti, Cu, etc., optionally together with a gas containing Si atoms are introduced into the mixer 5. The gases are controlled in flow rates so that the respective partial pressures may become desired values.

In the case of forming a film by this device, the first starting gas may be of course $MMAH_2$, but DMAH with a vapor pressure enough to become 1 Torr at room temperature is the most preferred. Also, DMAH and $MMAH_2$ may be used in a mixture.

As the second starting gas containing Ti, there can be used $TiCl_3$, $TiCl_4$, $TiBr_4$, $Ti(CH_3)_4$, etc. Of these compounds, $TiCl_4$ and $Ti(CH_3)_4$ which can be easily decomposed at the low temperature of 200–300° C. are most preferable. As the second starting gas containing Si, there can be used $Si_2H_6$, $SiH_4$, $Si_3H_8$, $Si(CH_3)_4$, $SiCl_4$, $SiH_2Cl_2$ and $SiH_3Cl$. Of these compounds, $Si_2H_6$ which can be easily decomposed at the low temperature of 200–300° C. are most preferably. The gases such as $TiCl_4$ (and $Si_2H_6$, if desired) are diluted with H2 or Ar, transported to the mixer 5 through a line other than the DMAH line and supplied to the reaction tube 2.

The deposited film formed at a substrate temperature of 160° C. to 450° C. by use of such starting gas and reaction gas, with a thickness of, for example, 400 Å, has a resistivity at room temperature of 3.0–6.0 $\mu$ohm·cm which is substantially equal to Al bulk resistivity, and is a continuous and flat film. At this time, the pressure during film formation can be chosen within the range from $10^{-3}$ Torr to 760 Torr. Also, even when the film thickness may be, for example, 1 $\mu$m, its resistivity is ca. 3.0–8.0 $\mu$ohm·cm, and a sufficiently dense film can be formed also with a relatively thicker film. Also, the reflectance in the visible light wavelength region is approximately 80%, whereby a thin film excellent in surface flatness can be deposited.

The substrate temperature is desirably a temperature which is not lower than the decomposition temperatures of the starting gas containing Al and the starting gas containing Ti (and the gas containing Si, if employed) and not higher than 450° C. as described above, but specifically the substrate temperature of 220° to 450° C. is more desirable, and when deposition is carried out under this condition, by making the DMAH partial pressure 10-4 to 10-3 Torr, the deposition speed becomes very great as 100 Å/min. to 700 Å/min., whereby sufficient great deposition speed as the Al-Ti (or Al-Si-Ti) deposition technique for ultra-LSI can be obtained.

A more preferable substrate temperature condition is 250° C. to 350° C., and the Al-Ti film, etc. deposited under this condition is also strongly orientatable and, even when subjected to the heat treatment at 450° C. for 1 hour, the Al-Ti film on the Si monocrystalline or Si polycrystalline substrate becomes a good Al-Ti film without generation of hillock or spike. Also, such Al-Ti film is excellent in electro-migration resistance as compared to Al film.

As the gas containing Cu as the second starting gas (additive gas), bisacetylacetonate copper $Cu(C_5H_7O_2)_2$, bisdipivaloylmethanate copper $Cu(C_{11}H_{19}O_2)_2$, bishexafluoroacetylacetonate copper $Cu(C_5HF_6O_2)_2$ can be employed.

Among them, $Cu(C_2H_7O_2)_2$ having the least carbon content and containing no F is the most preferable.

However, since the above material is solid at room temperature and is required to be transported by sublimation, and it is necessary to heat preliminarily the second starting gas (additive gas) line 23, the mixer 5 and the reaction tube 2 to about 180° C.

Also, it is more effective to flow a carrier gas such as Ar or $H_2$ through the second starting gas line 23.

As the gas containing Si as the third gas, $Si_2H_6$, $SiH_4$, $Si_3H_8$, $Si(CH_3)_4$, $SiCl_4$, $SiH_2Cl_2$, $SiH_3Cl$ can be employed. Above all, $Si_2H_6$ which is readily decomposable at a low temperature of 200° C. to 300° C. is the most desirable. The gases such as $Si_2H_6$ are diluted with $H_2$ or Ar, transported to the mixer 5 through a line 22 other than the DMAH line and supplied to the reaction tube 2.

When a film formed at a substrate temperature of 220° C.–450° C. by use of such starting gas and reaction gas is analyzed according to Auger's electron spectroscopy or photoelectric spectroscopy, no entrainment of an impurity such as carbon or oxygen is observed in this film.

The deposited film thus formed has a resistivity of, for example, with a film thickness of 400 Å, 2.7–3.0 μohm·cm at room temperature which is substantially equal to the bulk resistivity of Al, and becomes continuous and flat film. Also, even with a film thickness of 1 μm, its resistance at room temperature is approximately 2.7–3.0 μohm·cm and a sufficiently dense film is formed with a relatively thicker film. The reflectance in the visible wavelength region is approximately 80%, and a thin film with excellent surface flatness can be deposited.

The substrate temperature is desirably a temperature which is not lower than the decomposition temperature of the starting gas containing Al and not higher than 450° C. as described above, but specifically the substrate temperature of 220° C. to 450° C. is more desirable, and when deposition is carried out under this condition, by making the DMAH partial pressure $10^{-4}$ to $10^{-3}$ Torr, the deposition speed becomes very great as 400 Å/min. to 1000 Å/min., whereby sufficient great deposition speed as the Al-Si-Cu deposition technique for ultra-LSI can be obtained.

A more preferable substrate temperature condition is 250° C. to 350° C., and the Al-Si-Cu film deposited under this condition is also strongly orientatable and, even when subjected to the heat treatment at 450° C. for 1 hour, the Al-Si-Cu film on the Si monocrystalline or Si polycrystalline substrate or on an oxide film becomes a good Al-Si-Cu film without generation of hillock or spike. Also, such Al-Si-Cu film is excellent in electromigration resistance, and the contents of Si and Cu in the film can be easily controlled.

In the device shown in FIG. 1, additive-containing Al can be deposited on only one sheet of substrate in deposition for one time. Although a deposition speed of ca. 800 Å/min. can be obtained, it is still insufficient for performing deposition of a large number of sheets within a short time.

As the deposition film forming device for improving this point, there is the low pressure CVD device which can deposit additive-containing Al by simultaneous mounting of a large number of sheets of wafer. Since the Al film formation according to the present invention utilizes the surface reaction on the electron donative substrate surface, in the hot wall type low pressure CVD method wherein only the substrate is heated, Al can be deposited on the substrate by use of DMAH and $H_2$ and the addition gas. For example, by adding DMAH, $H_2$ and a Ti starting gas such as $TiCl_4$, etc., an Al-Ti film can be deposited which contains 0.5–2.0% of Ti.

The pressure within the reaction tube is 0.05–760 Torr, preferably 0.1–0.8 Torr; the substrate temperature is 160° C.–450° C., preferably 220° C.–400° C.; the DMAH partial pressure is $1 \times 10^{-5}$ to $1.3 \times 10^{-3}$-fold of the pressure within the reaction tube; and the TiCl4 partial pressure is $1 \times 10^{-7}$–$1 \times 10^{-4}$ fold of the pressure within the reaction tube. Under a such condition, Al-Ti is deposited on an electron donative substrate.

For example, by adding DMAH, $H_2$, a Cu starting gas such as $Cu(C_5H_7O_2)_2$, etc. and an Si starting gas such as $Si_2H_6$, etc., an Al-Si-Cu film can be deposited which contains 0.5–2.0% of Cu and 0.5–2.0% of Si.

The pressure within the reaction tube is 0.05–760 Torr, preferably 0.1–0.8 Torr; the substrate temperature is 220° C.–450° C., preferably 250° C.–400° C.; the DMAH partial pressure is $1 \times 10^{-5}$ to $1.3 \times 10^{-3}$-fold of the pressure within the reaction tube; the $Cu(C_5H_7O_2)_2$ partial pressure is $5 \times 10^{-7}$–$5 \times 10^{-4}$-fold of the pressure within the reaction tube; and the $Si_2H_6$ partial pressure is $1 \times 10^{-7}$ to $1 \times 10^{-4}$-fold of the pressure within the reaction tube. Under such a condition, Al-Si-Cu is deposited on an electron donative substrate.

Figure 2:
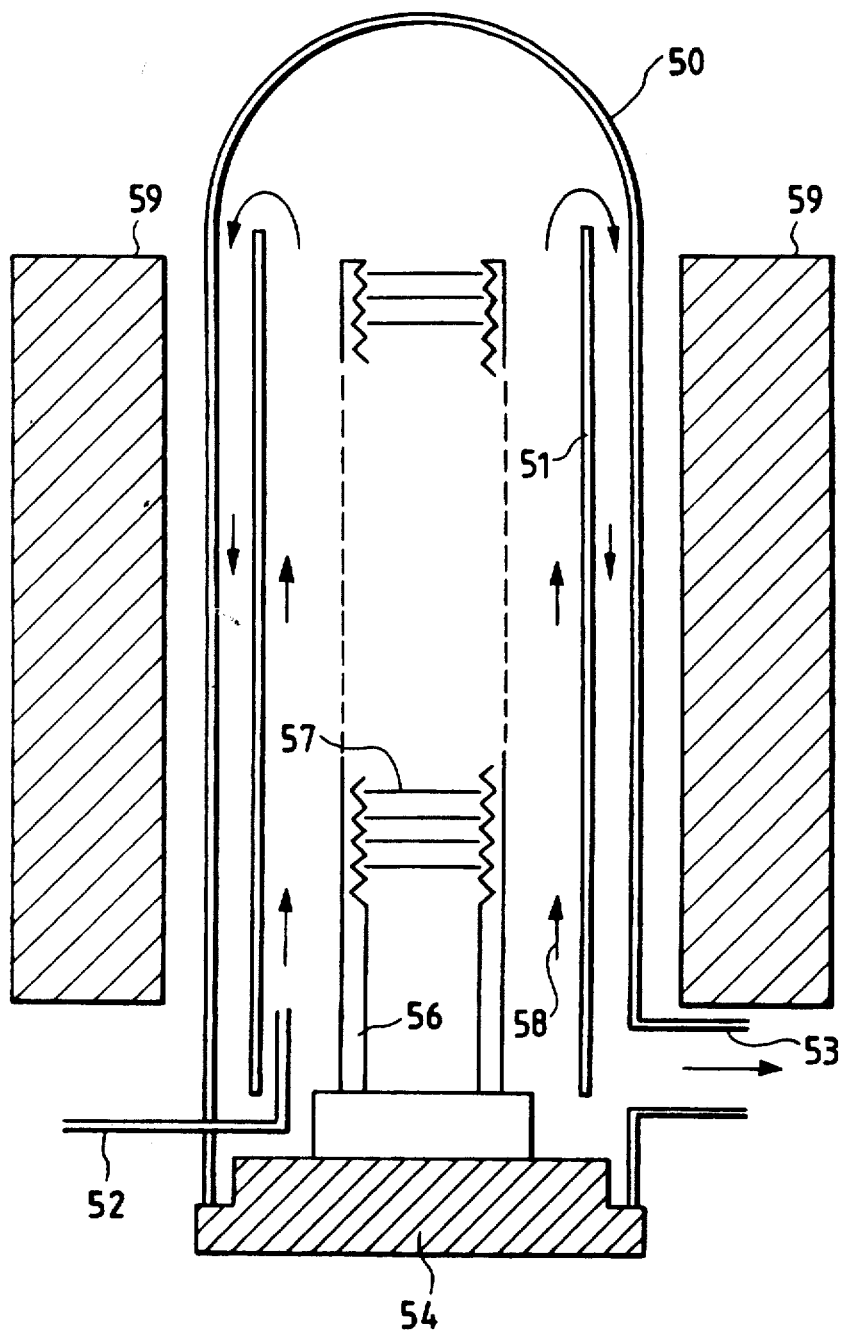
FIG. 2 is a schematic view for illustration of another suitable deposited film forming apparatus in practicing the deposited film forming process according to the present invention.

FIG. 2 is a schematic illustration showing a deposited film forming device to which such present invention is applicable.

57 is a substrate for formation of additive-containing Al film. 50 is an outside reaction tube made of quartz for forming a space for formation of deposited film substantially closed to the surrounding, 51 an innerside reaction tube made of quartz located for separating the flow of gas within the outside reaction tube 50, 54 a flange made of a metal for opening and closing of the opening of the outside reaction tube 50, and the substrate 57 is located within the substrate holding member 56 provided internally of the innerside reaction tube 51. The substrate holding member 56 should be preferably made of quartz.

Also, in the present device, the substrate temperature can be controlled by the heater portion 59. The pressure internally of the reaction tube 50 is constituted so as to be controllable by the evacuation system connected through the gas evacuation outlet 53.

The gas feeding system is constituted to have a first gas system, a second gas system, a third gas system and a mixer (none are shown in FIG. 2) similarly as the device shown by the symbols 5 and 6 in FIG. 1, and the starting gases and the reaction gas are introduced into the reaction tube 50 through the starting gas inlet 52. These gases react on the surface of the substrate 57 during passage internally of the innerside reaction tube 51 as shown by the arrowhead 58 in FIG. 2 to deposit additive-containing Al on the substrate surface. The gases after the reaction pass through the gap formed between the innerside reaction tube 51 and the outside reaction tube 50, and evacuated through the gas evacuation outlet 53.

In taking the substrate in and out, the flange 54 made of a metal is permitted to fall by an elevator (not shown) together with the substrate holding member 56 and the substrate 57 to be moved to a predetermined position where the substrate is mounted and detached.

By forming a deposited film under the conditions as described above by use of such device, additive-containing Al films of good quality can be formed in all the wafers within the device.

As described above, the film obtained according to the additive-containing Al film formation process based on the embodiment of the present invention is dense with little content of impurity such as carbon, etc. and resistivity which is similar to bulk, and also has high surface smoothness, and therefore remarkable effects as described below can be obtained.

(1) Reduction of hillock

Hillock is occurrence of concavities on the Al surface due to partial migration of Al when inner stress during film formation is released in the heat treatment step. Also, similar phenomenon occurs by local migration by current passage. The additive-containing Al film formed by the present invention has little inner stress and is approximate to the state of monocrystal. For this reason, in the heat treatment at 450° C. for one hour, as contrasted to formation of $10^{-4}-10^6/cm^2$ of hillocks in the Al film of the prior art, the hillock number could be greatly improved as 0 to $10/cm^2$. Thus, due to substantial absence of additive-containing Al surface concavity, the resist film thickness and the interlayer insulating film can be made thin to be advantageous for making it finer and more flat. Furthermore, the additive-containing Al has reproducibility superior to that of Al-Si containing no additive.

(2) Improvement of electro-migration resistance

Electro-migration is the phenomenon that the wiring atoms move by passage of a current of high density. By this phenomenon, voids are generated and grown along the grain boundary, whereby as accompanied with reduction of the cross-sectional area, the wiring generates heat to be broken. In the prior art, the anti-migration property has been improved by adding Cu, Ti, etc. to Al to form an alloy. However, the alloy formation results in complication of the etching step and difficulty of minute formation.

Migration resistance is generally evaluated by average wiring life.

The wiring formed by the sputtering method or the CVD method of the prior art has obtained an average wiring life of $1 \times 10^2$ to $10^3$ hours (in the case of a wiring cross-sectional area of 1 $\mu m^2$) under the current passage test conditions of 250° C., $1 \times 10^6$ A/cm$^2$. In contrast, the additive-containing Al film obtained by the additive-containing Al film formation method based on the embodiment of the present invention could obtain an average wiring life of $10^3$ to $10^4$ hours with a wiring having a cross-sectional area of 1 $\mu m^2$.

Hence, according to the present invention, for example, when the wiring width is 0.8 $\mu$m, a wiring layer thickness of 0.3 $\mu$m can sufficiently stand practical application. That is, since the wiring layer thickness can be made thinner, unevenness on the semiconductor surface after arrangement of wiring can be suppressed minimum, and also high reliability in passing ordinary current can be obtained. Also, this is possible by a very simple process. Furthermore, the additive-containing Al has reproducibility superior to that of Al-Si containing no additive.

(3) Reduction of alloy pits in contact portion

By the heat treatment in the wiring step, eutectic reaction between Al in the wiring material and Si in the substrate may occur to result in penetration of Al-Si eutectic called as alloy pit into the substrate in spike pattern, thereby destroying shallow junction.

As countermeasure, it is general to employ a material other than pure Al when the depth of junction is 0.3 $\mu$m or more and to employ barrier metal technique of Ti, W, Mo type.

However, there remain some points to be improved such as complication of etching, rise of contact resistivity and the like. In additive-containing Al formed according to the present invention, generation of alloy pits in contact portion with substrate crystal due to heat treatment in the wiring step can be inhibited and wiring with good contact can also be obtained. In other words, wiring can be effected only with an Al-Si material without destroying junction even when the junction is formed in a depth of about 0.1 $\mu$m.

(4) Improvement of surface smoothness (patterning characteristic improvement of wiring)

In the prior art, roughness of the surface of a metal thin film caused inconvenience in the alignment step for the mask and the substrate in the patterning step and in the etching step.

That is, there is unevenness extending to several $\mu$m on the surface of Al film according to the prior art method, whereby the surface morphology is poor, and therefore had the following disadvantages.

1) Alignment signals cause diffused reflection to occur at the surface, whereby noise level becomes higher and inherent alignment signals cannot be discriminated.

2) For covering large surface unevenness, the resist film thickness must be made large, which is opposite to fine formation.

3) If the surface morphology is poor, halation due to the resist internal reflection will occur locally, whereby resist remaining occurs.

4) If the surface morphology is poor, the side wall becomes notched in the wiring etching step according to its unevenness.

According to the present invention, the surface morphology of additive-containing Al film to be formed is markedly improved to cancel all the drawbacks described above.

In other words, in the patterning step, at the line width of the resolving power limit of the exposure machine, the alignment precision $3=0.15$ $\mu$m can be accomplished, whereby wiring having smooth side plane is rendered possible without causing halation to occur. Furthermore, the additive-containing Al has reproducibility superior to that of Al-Si containing no additive.

(5) Improvement of resistance in contact hole and through hole and of contact resistance.

In the prior art method, if the size of the contact hole becomes finer as 1 $\mu$m × 1 $\mu$m or less, Si in the wiring is precipitated on the substrate of the contact hole during heat treatment in the wiring step to cover thereover, whereby resistance between the wiring and the element becomes markedly larger.

According to the present invention, since a dense film is formed according to the surface reaction, Al-Ti has been confirmed to have a resistivity of 3.0-6.0 $\mu$ohm·cm. Also, the contact resistivity can attain $1 \times 10^{-6}$ ohm·cm$^2$ at an area of 0.6 $\mu$m × 0.6 $\mu$m when the Si portion has an impurity of $10^{20}$ cm$^{-3}$.

According to the present invention, since a dense film is formed by the surface reaction, it has been confirmed that the Al-Si-Cu completely filled within the contact hole and through hole each has a resistivity of 2.7-3.3 $\mu$ohm·cm. Also, the contact resistivity can attain $1 \times 10^{-6}$ ohm·cm$^2$ in the case where the Si portion has an impurity of $10^{20}$ cm$^{-3}$ in a hole of 0.8 $\mu$m × 0.8 $\mu$m.

That is, according to the present invention, the wiring material can be completely embedded only in the minute opening, and also good contact with the substrate can be obtained. Therefore, the present invention can contribute greatly to improvement of resistance within hole and contact resistance which have been the greatest problems in the fine process of 1 μm or less.

FIGS. 3A–3E show how the additive-containing Al film according to the present invention is selectively grown.

Figure 3A:
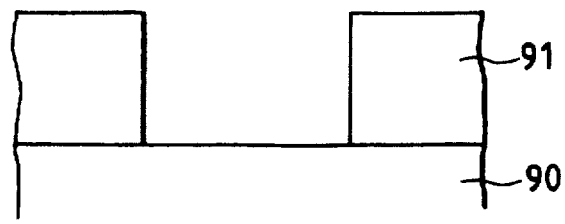
FIGS. 3A–3E are schematic sectional views for illustration of the deposited film forming process according to one embodiment of the present invention.

FIG. 3A is an illustration showing schematically the cross-section of the substrate before formation of the additive-containing Al deposited film according to the present invention. 90 is the substrate comprising an electron donative material, and 91 a thin film comprising an electron non-donative material.

Figure 3B:
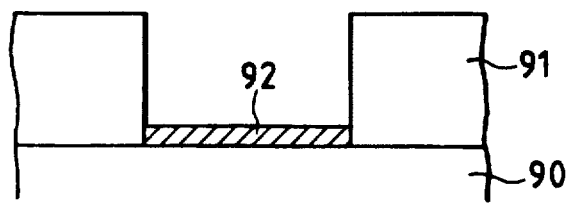

In the case of using DMAH and a gas containing an additive as the starting gases optionally together with a gas containing Si atoms, when a gas mixture containing $H_2$ as the reaction gas is fed onto the substrate 1 heated to a temperature not lower than the decomposition temperatures of DMAH and the gas containing an additive and not higher than 450° C., additive-containing Al is deposited on the substrate 90, whereby a continuous film of additive-containing Al is formed as shown in FIG. 3B.

For example, when a gas mixture containing DMAH as the starting gas, $TiCl_4$ as the addition gas and $H_2$ as the reaction gas is fed onto the substrate 1 heated to a temperature not lower than the decomposition temperatures of DMAH and $TiCl_4$ and not higher than 450° C., Al-Ti is deposited on the substrate 90, whereby a continuous film of Al-Ti is formed as shown in FIG. 3B. Here, the pressure within the reaction tube 2 should be desirably $10^{-3}$ to 760 Torr, and the DMAH partial pressure preferably $1.5 \times 10^{-5}$ to $1.3 \times 10^{-3}$-fold of the pressure within the above reaction tube.

Figure 3C:
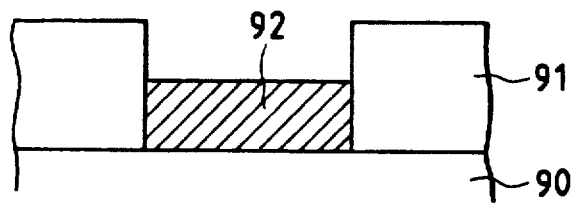
Figure 3D:
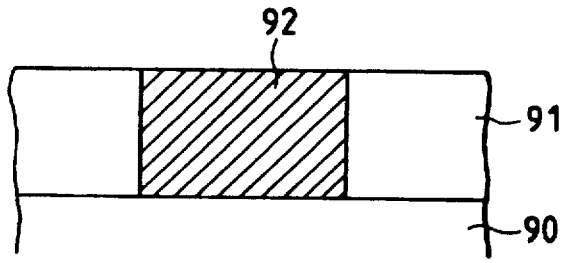
Figure 3E:
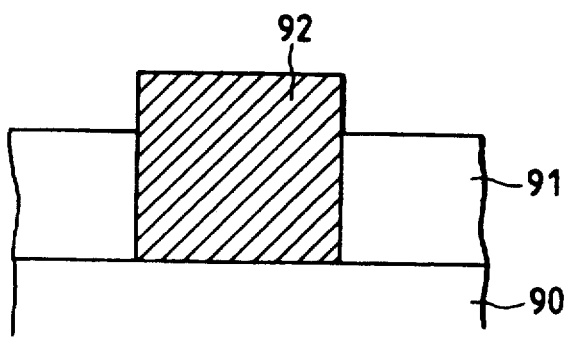

When deposition of Al-Ti is continued under the above conditions, via the state of FIG. 3C, the Al-Ti film grows to the level of the uppermost portion of the thin film 91 as shown in FIG. 3D. Further, when grown under the same conditions, as shown in FIG. 3E, the Al-Ti film can grow to 2000 Å or more substantially without growth in the lateral direction. This is the most characteristic point of the deposited film obtained by the present invention, and it will be understood how a film of good quality can be formed under good selectivity.

As the result of analysis according to Auger's electron spectroscopy or photoelectric spectroscopy, no entrainment of an impurity such as carbon or oxygen is recognized in this film.

The deposited film thus formed has a resistivity of, for example, with a film thickness of 400 Å, 3.0–6.0 μohm·cm at room temperature which is substantially equal to the bulk resistivity of Al, and becomes continuous and flat film. Also, even with a film thickness of 1 μm, its resistance at room temperature is approximately 3.0–8.0 μohm·cm and a sufficiently dense film is formed with a relatively thicker film. The reflectance in the visible wavelength region is approximately 80%, and a thin film with excellent surface flatness can be deposited.

The substrate temperature in performing such selective deposition should be desirably not lower than the decomposition temperatures of the starting gas containing Al and the starting gas containing Ti and not higher than 450° C. as mentioned above, but specifically a substrate temperature of 220° C. to 450° C. is desirable, and when deposition is performed under such condition, the deposition speed is sufficiently great as 100 Å/min. to 700 Å/min. when DMAH partial pressure is $10^{-4}$ to $10^{-3}$ Torr. Thus a sufficiently great deposition speed can be obtained as the Al-Ti deposition technique for ultra-LSI.

A more preferable substrate temperature condition is 250° C. to 350° C., and the Al-Ti film deposited under this condition is also strongly orientatable and, even when subjected to the heat treatment at 450° C. for 1 hour, the Al-Ti film on the Si monocrystalline or Si polycrystalline substrate becomes a good Al-Ti film without generation of hillock and spike. Also, such Al-Ti film is excellent in electro-migration resistance as compared with Al film.

Also, when a gas mixture containing DMAH optionally together with $Si_2H_6$ as the starting gase, $Cu(C_5H_7O_2)_2$ as the addition gas and $H_2$ as the reaction gas is fed onto the substrate 1 heated within a temperature range from the decomposition temperature of DMAH to 450° C., Al-Si-Cu is deposited on the substrate 90, whereby a continuous film of Al-Si-Cu is formed as shown in FIG. 3B. Here, the pressure within the reaction tube 2 should be desirably $10^{-3}$ to 760 Torr, and the DMAH partial pressure preferably $1.5 \times 10^{-5}$ to $1.3 \times 10^{-3}$-fold of the pressure within the above reaction tube. The $Cu(C_5H_7O_2)_2$ partial pressure should preferably be $5 \times 10^{-5}$ to $5 \times 10^{-4}$-fold of the pressure within the reaction tube, and the $Si_2H_6$ partial pressure should preferably be $1 \times 10^{-7}$ to $1 \times 10^{-4}$-fold of the pressure within the reaction tube 2.

When deposition of Al-Si-Cu is continued under the above conditions, via the state of FIG. 3C, the Al-Si-Cu film grows to the level of the uppermost portion of the thin film 91 as shown in FIG. 3D. Further, when grown under the same conditions, as shown in FIG. 3E, the Al-Si-Cu film can grow to 5000 Å substantially without growth in the lateral direction. This is the most characteristic point of the deposited film obtained by the present invention, and it will be understood how a film of good quality can be formed under good selectivity.

As the result of analysis according to Auger's electron spectroscopy or photoelectric spectroscopy, no entrainment of an impurity such as carbon or oxygen is recognized in this film.

The deposited film thus formed has a resistivity of, for example, with a film thickness of 400 Å, 2.7–3.0 μohm·cm at room temperature which is substantially equal to the bulk resistivity of Al, and becomes continuous and flat film. Also, even with a film thickness of 1 μm, its resistance at room temperature is approximately 2.7–3.0 μohm·cm and a sufficiently dense film is formed with a relatively thicker film. The reflectance in the visible wavelength region is approximately 80%, and a thin film with excellent surface flatness can be deposited.

The substrate temperature in performing such selective deposition should be desirably the decomposition temperature of the starting gas containing Al or higher and 450° C. or lower as mentioned above, but specifically a substrate temperature of 220° C. to 450° C. is desirable, and when deposition is performed under such condition, the deposition speed is sufficiently great as 400 Å/min. to 1000 Å/min. when DMAH partial pressure is $10^{-4}$ to $10^{-3}$ Torr. Thus a sufficiently great deposition speed can be obtained as the Al-Si-Cu deposition technique for ultra-LSI.

A more preferable substrate temperature condition is 250° C. to 350° C., and the Al-Si-Cu film deposited under this condition is also strongly orientatable and, even when subjected to the heat treatment at 450° C. for 1 hour, the Al-Si-Cu film on the Si monocrystalline or Si polycrystalline substrate or an oxide film becomes a good Al-Si-Cu film without generation of hillock and spike. Also, such Al-Si-Cu film is excellent in electromigration resistance and the contents of Si and Cu of the film can easily be controlled.

It is possible to make the heat treatment temperature during wiring step lower or to omit the heat treatment step.

As described in detail above, by applying the present invention to the wiring formation method of a semiconductor integrated circuit, particularly embedding of contact hole or through hole, the yield can be improved, and reduction of cost can be promoted to great extent as compared with metallic wiring of the prior art.

EXAMPLE 1

First, the procedure for Al-Ti film formation is as follows. By use of the device shown in FIG. 1, the reaction tube 2 is internally evacuated to ca. $1 \times 10^{-8}$ Torr by the evacuation unit 9. However, Al-Ti film can be also formed if the vacuum degree within the reaction tube 2 may be worse than $1 \times 10^{-8}$ Torr.

After washing of Si wafer, the conveying chamber 10 is released to atmospheric pressure and Si wafer is mounted in the conveying chamber. The conveying chamber is evacuated to ca. $10^{-6}$ Torr, and then the gate valve 13 is opened and the wafer is mounted on the wafer holder 3.

After mounting of the wafer on the wafer holder 3, the gate valve 13 is closed, and the reaction chamber 2 is evacuated to a vacuum degree of ca. $1 \times 10^{-8}$ Torr.

In this Example, DMAH is fed through the first gas line. As the carrier gas of DMAH line, $H_2$ is employed. The second gas line is used for $H_2$ and the third gas line for $TiCl_4$. The carrier gas is also $H_2$.

By passing $H_2$ through the second gas line, the pressure within the reaction tube 2 is made a predetermined value by controlling the opening of the slow leak valve 8. A typical pressure in this Example is made approximately 1.5 Torr. Then, the wafer is heated by current passage through the heater 4. After the wafer temperature has reached a predetermined temperature, DMAH and $TiCl_4$ are introduced into the reaction tube through the DMAH line and the $TiCl_4$ line. The total pressure is ca. 1.5 Torr, and the DMAH partial pressure is made ca. $1.5 \times 10^{-4}$ Torr. The $TiCl_4$ partial pressure is made $1.5 \times 10^{-6}$ Torr. When $TiCl_4$ and DMAH are introduced into the reaction tube 2, Al-Ti is deposited. After a predetermined deposition time has elapsed, feeding of DMAH and $TiCl_4$ is stopped. Next, heating of the heater 4 is stopped to cool the wafer. Feeding of $H_2$ gas is stopped, and after evacuation internally of the reaction tube, the wafer is transferred to the conveying chamber, and only the conveying chamber is made atmospheric before taking out the wafer. The outline of Al-Ti film formation is as described above.

Al-Ti films were deposited at the respective temperatures each for 10 sheet samples following the same procedure as described in Example 1 under the following conditions:

Total pressure: 1.5 Torr
DMAH partial pressure: $1.5 \times 10^{-4}$ Torr
$TiCl_4$ partial pressure: $2 \times 10^{-6}$ Torr.

The Al-Ti films deposited by varying the substrate temperature at 13 levels were evaluated by use of various evaluation methods. The results are shown in Table 1.

It has been confirmed from the results that films of extremely excellent quality can be obtained within the temperature range of 200° C. to 400° C.

EXAMPLE 2

Following the same procedure as in Example 1 to set the parameters as follows:

Total pressure: 1.5 Torr
DMAH partial pressure: $5 \times 10^{-4}$ Torr
Substrate temperature (Tsub): 300° C.

and the $TiCl_4$ partial pressure was varied from $1.5 \times 10^{-7}$ Torr to $1 \times 10^{-4}$ Torr to effect deposition. The Ti content (wt. %) of the Al-Ti films were varied from 0.001% to 4.2% approximately in proportion to the $TiCl_4$ partial pressure. As to resistivity, carbon content, average wiring life, deposition speed, hillock density and spike generation, the same results as in Example 1 were obtained. However, in samples having a Ti content of 3.5% or higher, the surface morphology became bad, thereby making the reflectance 65% or lower. Samples having a Ti content of less than 3% exhibited a reflectance of 80 to 90%, which was the same as in Example 1.

EXAMPLE 3

First, the procedure of Al-Ti film formation is as follows. By the evacuation unit 9, the reaction tube is evacuated internally to ca. $1 \times 10^{-8}$ Torr. Al-Ti film can be formed even if the vacuum degree in the reaction tube 2 may be higher than $1 \times 10^{-8}$ Torr.

After washing of the Si wafer, the conveying chamber 10 is released to atmospheric pressure and the Si wafer is mounted in the conveying chamber. The conveying chamber is evacuated to ca. $1 \times 10^{-6}$ Torr, then the gate valve 13 is opened and the wafer is mounted on the wafer holder 3.

After mounting of the wafer holder 3, the gate valve 13 is evacuated to a vacuum degree in the reaction chamber 2 of ca. $1 \times 10^{-8}$ Torr.

In this Example, the first gas line is used for DMAH. As the carrier gas for the DMAH line, Ar is employed. The second gas line is used for $H_2$. The third gas line is provided for $TiCl_4$.

By passing $H_2$ through the second gas line, the pressure within the reaction tube 2 is made a predetermined value by controlling the opening of the slow leak valve 8. A typical pressure in this Example is made approximately 1.5 Torr. Then, the wafer is heated by current passage through the heater 4. After the wafer temperature has reached a predetermined temperature, DMAH and $TiCl_4$ are introduced into the reaction tube through the DMAH line and the $TiCl_4$ line. The total pressure is ca. 1.5 Torr, and the DMAH partial pressure is made ca. $1.5 \times 10^{-4}$ Torr. The $TiCl_4$ partial pressure is made $1.5 \times 10^{-5}$ Torr. When $TiCl_4$ and DMAH are introduced into the reaction tube 2, Al-Ti is deposited. After a predetermined deposition time has elapsed, feeding of DMAH and $TiCl_4$ is stopped. Next, heating of the heater 4 is stopped to cool the wafer. Feeding of $H_2$ gas is stopped, and after evacuation internally of the reaction tube, the wafer is transferred to the conveying chamber, and only the conveying chamber is made atmospheric pressure before taking out the wafer. The outline of Al-Ti film formation is as described above.

For deposited films thus formed concerning resistivity, carbon content, average wiring life, deposition speed, hillock density, generation of spike and reflectance, the same results as in Example 1 were obtained.

EXAMPLE 4

Following the same procedure as in Example 3 to set the parameters as follows:

Total pressure: 1.5 Torr
DMAH partial pressure: $5 \times 10^{-4}$ Torr
Substrate temperature (Tsub): 300° C.

and the TiCl$_4$ partial pressure was varied from $1.5 \times 10^{-7}$ Torr to $1 \times 10^{-4}$ Torr to effect deposition. The Ti content (wt. %) of the Al-Ti films were varied from 0.001% to 4.2% approximately in proportion to the TiCl$_4$ partial pressure. As to resistivity, carbon content, average wiring life, deposition speed, hillock density and spike generation, the same results as in Example 1 were obtained. However, in samples having a Ti content of 3.5% or higher, the surface morphology became bad, thereby making the reflectance 65% or lower. Samples having a Ti content of less than 3% exhibited a reflectance of 80 to 90%, which was the same as in Example 1.

EXAMPLE 5

A silicon substrate was placed in the low pressure CVD method shown in FIG. 2, and Al-Ti film was formed within the same badge. The film formation conditions were made a reaction tube pressure of 0.3 Torr, a DMAH partial pressure of $3.0 \times 10^{-5}$ Torr, a TiCl$_4$ partial pressure of $0.7 \times 10^{-6}$ Torr, a substrate temperature of 300° C., and a film formation time of 10 minutes.

As the result of film formation under such conditions, an Al-Ti film of 7000 Å was deposited. The film quality was very good, exhibiting the same properties as one prepared at a substrate temperature of 300° C. shown in Example 1.

EXAMPLE 6

The procedure of Example 1 was repeated to effect deposition with the exception that MMAH$_2$ was used as the starting gas and the parameters were set as follows:

Total pressure: 1.5 Torr
MMAH$_2$ partial pressure: $5 \times 10^{-4}$ Torr
TiCl$_4$ partial pressure: $0.7 \times 10^{-5}$ Torr As a result, Al-Ti thin films were deposited within the substrate temperature range of 160° C. to 400° C. which contained no carbon impurity and were excellent in flatness and denseness similarly as in Example 1.

EXAMPLE 7

The procedure of Example 1 was repeated to effect deposition with the exception that Ti(CH$_3$)$_4$ was used in place of TiCl$_4$ as the starting material containing Ti and the parameters were set as follows:

Total pressure: 1.5 Torr
DMAH partial pressure: $5 \times 10^{-4}$ Torr
Ti(CH$_3$)$_4$ partial pressure: $1.5 \times 10^{-5}$ Torr As a result, Al-Ti thin films were deposited within the substrate temperature range of 160° C. to 400° C. which contained no carbon impurity and were excellent in flatness and denseness similarly as in Example 1.

EXAMPLE 8

Formation of Al-Si-Ti is effected by use of the device shown in FIG. 1. The reaction tube 2 is internally evacuated to ca. $1 \times 10^{-8}$ Torr by the evacuation unit 9. However, Al-Si-Ti film can be also formed even if the vacuum degree within the reaction tube 2 may be worse than $1 \times 10^{-8}$ Torr.

After washing of the Si wafer, the conveying chamber 10 is released to atmospheric pressure and the Si wafer is mounted in the conveying chamber. The conveying chamber is evacuated to ca. $1 \times 10^{-6}$ Torr, then the gate valve 13 is opened and the wafer is mounted on the wafer holder 3.

After mounting of the wafer on the wafer holder 3, the gate valve 13 is closed, and the reaction chamber 2 is evacuated to a vacuum degree of ca. $1 \times 10^{-8}$ Torr.

In this Example, DMAH is fed through the first gas line. As the carrier gas of DMAH line, H$_2$ is employed. The second gas line is used for H$_2$ and the third gas line for TiCl$_4$ diluted with H$_2$. The fourth gas line is provided for Si$_2$H$_6$. The third gas line, the mixer and the reaction tube are previously heated to 180° C. ± 10° C.

By passing H$_2$ through the second gas line, the pressure within the reaction tube 2 is made a predetermined value by controlling the opening of the slow leak valve 8. A typical pressure in this Example is made approximately 1.5 Torr. Then, the wafer is heated by current passage through the heater 4. After the wafer temperature has reached a predetermined temperature, DMAH, TiCl$_4$ and Si$_2$H$_6$ are introduced into the reaction tube through the DMAH line, the TiCl$_4$ line and the Si$_2$H$_6$ line. The total pressure is ca. 1.5 Torr, and the DMAH partial pressure is made ca. $1.5 \times 10^{-4}$ Torr. The TiCl$_4$ partial pressure is made $1 \times 10^{-6}$ Torr and the Si$_2$H$_6$ partial pressure is made $1 \times 10^{-5}$ Torr. When Si$_2$H$_6$ and DMAH are introduced into the reaction tube 2, Al-Si-Ti is deposited. After a predetermined deposition time has elapsed, feeding of DMAH, TiCl$_4$ and Si$_2$H$_6$ is stopped. Next, heating of the heater 4 is stopped to cool the wafer. Feeding of H$_2$ gas is stopped, and after evacuation internally of the reaction tube, the wafer is transferred to the conveying chamber, and only the conveying chamber is made atmospheric before taking out the wafer. The outline of Al-Si-Ti film formation is as described above.

Wafers were provided to deposit Al-Si-Ti films of 5000 Å thickness following the above described procedure under the following conditions.

Total pressure: 1.5 Torr
DMAH partial pressure: $1.5 \times 10^{-4}$ Torr
TiCl$_4$ partial pressure: $1 \times 10^{-6}$ Torr
Si$_2$H$_6$ partial pressure: $1 \times 10^{-5}$ Torr The Al-Si-Ti films thus formed were subjected to patterning according to conventional photolithographic technique to obtain test samples in which Al-Si-Ti remained in the widths of 2, 4 and 6 μm.

When the temperature (Ts) of substrate for deposition was varied to evaluate the characteristics of the deposited films, substantially the same results as those shown in Table 1 were obtained.

EXAMPLE 9

Following the same procedure as in Example 8 to set the parameters as follows:

Total pressure: 1.5 Torr
DMAH partial pressure: $5 \times 10^{-4}$ Torr
Si$_2$H$_6$ partial pressure: $1 \times 10^{-5}$ Torr
Substrate temperature (Tsub): 300° C.

and the TiCl$_4$ partial pressure was varied from $5 \times 10^{-7}$ Torr to $1 \times 10^{-4}$ Torr to effect deposition. The Ti content (wt. %) of the Al-Si-Ti films were varied from 0.3% to 4%. As to resistivity, carbon content, average wiring life, deposition speed, and hillock density, the same results as in Example 1 were obtained.

EXAMPLE 10

Following the same procedure as in Example 8 to set the parameters as follows:
Total pressure: 1.5 Torr
DMAH partial pressure: $5 \times 10^{-4}$ Torr
TiCl$_4$ partial pressure: $1 \times 10^{-6}$ Torr
Substrate temperature (Tsub): 300° C.
and the Si$_2$H$_6$ partial pressure was varied from $1.5 \times 10^{-7}$ Torr to $1 \times 10^{-4}$ Torr to effect deposition. The Si content (wt. %) of the Al-Si-Ti films were varied from 0.005% to 5% approximately in proportion to the Si$_2$H$_6$ partial pressure. As to resistivity, average wiring life, deposition speed and hillock density, the same results as in Example 8 were obtained. However, in samples having a Si content of 4% or higher, deposition was generated in the films which appeared to be Si to worsen surface morphology, thereby making the reflectance 60% or lower. Samples having a Si content of less than 4% exhibited a reflectance of 80 to 95%, which was the same as in Example 6.

EXAMPLE 11

The procedure of Example 6 was repeated to effect deposition Al-Si-Ti under the following conditions.
Total pressure: 1.5 Torr
DMAH partial pressure: $5 \times 10^{-4}$ Torr
Si$_2$H$_6$ partial pressure: $1 \times 10^{-5}$ Torr
TiCl$_4$ partial pressure: $1 \times 10^{-6}$ Torr As a result, Al-Si-Ti films were deposited within the substrate temperature range of 160° C. to 400° C. which were excellent in migration resistance, flatness and denseness similarly as in Example 6.

EXAMPLE 12

First, the procedure for Al-Ti film formation is as follows. By use of the device shown in FIG. 1, the reaction tube 2 is internally evacuated to ca. $1 \times 10^{-8}$ Torr by the evacuation unit 9. However, Al-Ti film can be also formed if the vacuum degree within the reaction tube 2 may be worse than $1 \times 10^{-8}$ Torr.

After washing of Si wafer, the conveying chamber 10 is released to atmospheric pressure and Si wafer is mounted in the conveying chamber. The conveying chamber is evacuated to ca. $10^{-6}$ Torr, and then the gate valve 13 is opened and the wafer is mounted on the wafer holder 3.

After mounting of the wafer on the wafer holder 3, the gate valve 13 is closed, and the reaction chamber 2 is evacuated to a vacuum degree of ca. $1 \times 10^{-8}$ Torr.

In this Example, DMAH is fed through the first gas line. As the carrier gas of DMAH line, H$_2$ is employed. The second gas line is used for H$_2$ and the third gas line for TiCl$_4$ diluted with H$_2$.

By passing H$_2$ through the second gas line, the pressure within the reaction tube 2 is made a predetermined value by controlling the opening of the slow leak valve 8. A typical pressure in this Example is made approximately 1.5 Torr. Then, the wafer is heated by current passage through the heater 4. After the wafer temperature has reached a predetermined temperature, DMAH and TiCl$_4$ are introduced into the reaction tube through the DMAH line and the TiCl$_4$ line. The total pressure is ca. 1.5 Torr, and the DMAH partial pressure is made ca. $1.5 \times 10^{-4}$ Torr. When DMAH is introduced into the reaction tube 2, Al-Ti is deposited. The TiCl$_4$ partial pressure is made $1.5 \times 10^{-6}$ Torr. After a predetermined deposition time has elapsed, feeding of DMAH and TiCl$_4$ is stopped. Next, heating of the heater 4 is stopped to cool the wafer. Feeding of H$_2$ gas is stopped, and after evacuation internally of the reaction tube, the wafer is transferred to the conveying chamber, and only the conveying chamber is made atmospheric before taking out the wafer. The outline of Al-Ti film formation is as described above.

Next, preparation of samples in this Example is explained below.

Si substrates (N type, 1–2 ohm·cm) were subjected to thermal oxidation at a temperature of 1000° C. according to the hydrogen combustion system (H$_2$: 4 liters/M, O$_2$: 2 liters/M).

The film thickness was 7000 Å ± 500 Å, and the refractive index 1.46. A photoresist was coated on the whole Si substrate, and a desired pattern was baked by an exposure machine. The pattern was such that various holes of 0.25 $\mu$m × 0.25 $\mu$m–100 $\mu$m × 100 $\mu$m were opened. After development of the resist, with the photoresist as the mask, the subbing SiO$_2$ was etched by the reactive ion etching (RIE), etc. to have the substrate Si partially exposed. Thus, 130 sheets of samples having various sizes of SiO$_2$ holes of 0.25 $\mu$m × 0.25 $\mu$m–100 $\mu$m × 100 $\mu$m were prepared, the substrate temperature was set at 13 levels, and for the samples at the respective temperatures, Al-Ti films were selectively deposited following the procedure as described above under the following conditions:

Total pressure: 1.5 Torr
DMAH partial pressure: $1.5 \times 10^{-4}$ Torr
TiCl$_4$ partial pressure: $1.5 \times 10^{-6}$ Torr The Al-Ti films deposited by varying the substrate temperature at 13 levels were evaluated by use of various evaluation methods. The results are shown in Table 2.

In the above samples, no Al was deposited on SiO$_2$ at a temperature range from 160° C. to 450° C., and Al-Ti (0.5%) was deposited only on the portion with opening of SiO$_2$ to have Si exposed. Also, when deposition was carried out in the above temperature range continuously for 2 hours, similar selective depositability was maintained.

EXAMPLE 13

First, the procedure for Al-Ti film formation is as follows. By use of the device shown in FIG. 1, the reaction tube 2 is internally evacuated to ca. $1 \times 10^{-8}$ Torr by the evacuation unit 9. However, Al-Ti film can be also formed if the vacuum degree within the reaction tube 2 may be worse than $1 \times 10^{-8}$ Torr.

After washing of Si wafer, the conveying chamber 10 is released to atmospheric pressure and Si wafer is mounted in the conveying chamber. The conveying chamber is evacuated to ca. $10^{-6}$ Torr, and then the gate valve 13 is opened and the wafer is mounted on the wafer holder 3.

After mounting of the wafer on the wafer holder 3, the gate valve 13 is closed, and the reaction chamber 2 is evacuated to a vacuum degree of ca. $1 \times 10^{-8}$ Torr.

In this Example, DMAH is fed through the first gas line. As the carrier gas of DMAH line H$_2$ is employed. The second gas line is used for H$_2$ and the third gas line for TiCl$_4$. The carrier gas is also H$_2$.

By passing H$_2$ through the second gas line, the pressure within the reaction tube 2 is made a predetermined value by controlling the opening of the slow leak valve 8. A typical pressure in this Example is made approximately 1.5 Torr. Then, the wafer is heated by current passage through the heater 4. After the wafer temperature has reached a predetermined temperature, DMAH and TiCl$_4$ diluted with H$_2$ are introduced into the reaction tube through the DMAH line and the TiCl$_4$ line. The total pressure is ca. 1.5 Torr, and the DMAH partial pressure is made ca. $1.5 \times 10^{-4}$ Torr. The TiCl$_4$ partial pressure is made $1.5 \times 10^{-6}$ Torr. When DMAH is introduced into the reaction tube 2, Al-Ti is deposited. After a predetermined deposition time has elapsed, feeding of DMAH is stopped. Next, heating of the heater 4 is stopped to cool the wafer. Feeding of H$_2$ gas is stopped, and after evacuation internally of the reaction tube, the wafer is transferred to the conveying chamber, and only the conveying chamber is made atmospheric before taking out the wafer. The outline of Al-Ti film formation is as described above.

For deposited films thus formed concerning resistivity, carbon content, average wiring life, deposition speed, hillock density, generation of spike and reflectance, the same results as in Example 12 were obtained.

As to the selective depositability depending on the material of the substrate, the same results as those in Example 12 were obtained.

EXAMPLE 14

By means of the low pressure CVD apparatus shown in FIG. 2, Al films were formed on the substrates with the constitutions as described below (Samples 2-1-2-179).

Preparation of Sample 2-1

On a monocrystalline silicon as the electron donative first substrate surface material, a thermally oxidized SiO$_2$ film as the electron non-donative second substrate surface material was formed, and patterning was effected according to the photolithographic steps as shown in Example 1 to have the monocrystalline silicon surface partially exposed.

The film thickness of the thermally oxidized SiO$_2$ film was found to be 7000 Å, with the size of the exposed portion of the monocrystalline silicon, namely opening being 3 μm × 3 μm. Thus, Sample 2-1 was prepared. (Hereinafter, such sample is expressed as "thermally oxidized SiO$_2$ (hereinafter abbreviated as T-SiO$_2$)-/monocrystalline silicon)".

Preparation of Samples 2-2-2-179

Sample 2-2 is an oxidized film formed by normal pressure CVD (hereinafter abbreviated as SiO$_2$)/monocrystalline silicon.

Sample 2-3 is a boron doped oxidized film formed by normal pressure CVD (hereinafter abbreviated as BSG)/monocrystalline silicon.

Sample 2-4 is a phosphorus doped oxidized film formed by normal pressure CVD (hereinafter abbreviated as PSG)/monocrystalline silicon.

Sample 2-5 is a phosphorus and boron doped oxidized film formed by normal pressure CVD (hereinafter abbreviated as BSPG)/monocrystalline silicon formed by normal pressure CVD.

Sample 2-6 is a nitrided film formed by plasma CVD (hereinafter abbreviated as P-SiN)/monocrystalline silicon.

Sample 2-7 is a thermally nitrided film (hereinafter abbreviated as T-SiN)/monocrystalline silicon.

Sample 2-8 is a nitrided film formed by low pressure CVD (hereinafter abbreviated as LP-SiN)/monocrystalline silicon.

Sample 2-9 is a nitrided film formed by ECR device (hereinafter abbreviated as ECR-SiN)/monocrystalline silicon.

Further, by combinations of the electron donative first substrate surface materials and the electron non-donative second substrate surface materials, Samples 2-11-2-179 shown in Table 3 were prepared. As the first substrate surface material, monocrystalline silicon (monocrystalline Si), polycrystalline silicon (polycrystalline Si), amorphous silicon (amorphous Si), tungsten (W), molybdenum (Mo), tantalum (Ta), tungsten silicide (WSi), titanium silicide (TiSi), aluminum (Al), aluminum silicon (Al-Si), titanium aluminum (Al-Ti), titanium nitride (TiN), copper (Cu), aluminum silicon copper (Al-Si-Cu), aluminum palladium (Al-Pd), titanium (Ti), molybdenum silicide (Mo-Si), tantalum silicide (Ta-Si) were employed. These samples and Al$_2$O$_3$ substrates, SiO$_2$ glass substrates were placed in the low pressure CVD device shown in Table 2, and Al-Ti films were formed within the same badge. The film forming conditions were a reaction tube pressure of 0.3 Torr, a DMAH partial pressure of $3.0 \times 10^{-5}$ Torr, a TiCl$_4$ partial pressure of $1 \times 10^{-6}$ Torr, a substrate temperature of 300° C. and a film formation time of 15 minutes.

As the result of film formation under such conditions, concerning all the samples applied with patterning from Sample 2-1 to 2-179, deposition of Al-Ti (1.5%) film occurred only on the electron donative first substrate surface film to embed completely the opening with the depth of 7000 Å. The film quality of the Al-Ti film was found to be very good, exhibiting the same properties as one prepared at a substrate temperature of 300° C. shown in Example 12. On the other hand, on the second substrate surface which is electron non-donative, no Al-Ti film was deposited at all, whereby complete selectivity was obtained. On both the Al$_2$O$_3$ substrate and the SiO$_2$ glass substrate which are electron non-donative, no Al-Ti film was deposited at all.

EXAMPLE 15

By use of the low pressure CVD device shown in FIG. 2, Al-Ti film was formed on the substrate with the constitution as described below.

On a thermally oxidized film as the electron non-donative second substrate surface material, a polycrystalline Si as the electron donative first substrate surface material was formed, patterning was effected according to the photolithographic steps as shown in Example 12 to have the thermally oxidized film surface partially exposed. The film thickness of the polycrystalline silicon at this time was 2000 Å, with the size of the thermally oxidized film exposed portion, namely opening being 3 μm × 3 μm. Such sample is called 1-1. By combinations of the electron non-donative second substrate surface materials (T-SiO$_2$, CVD-SiO$_2$, BSG, PSG, BPSG, P-SiN, T-SiN, LP-SiN, ECR-SiN) and the electron-donative first substrate surface materials (polycrystalline Si, amorphous Si, Al, W, Mo, Ta, WSi, TiSi, TaSi, Al-Si, Al-Ti, TiN, Cu, Al-Si-Cu, Al-Pd, Ti, Mo-Si), Samples of 1-1-1-169 shown in Table 4 were prepared. These samples were placed in the low CVD device shown in FIG. 2, and Al-Ti film was formed within the same batch. The film forming conditions were a reaction tube pressure of 0.3 Torr, a DMAH partial pressure of $3.0 \times 10^{-5}$ Torr, a TiCl$_4$ partial pressure of $1 \times 10^{-6}$ Torr, a substrate temperature of 300° C. and a film forming time of 15 minutes. As the result of film formation under such conditions, in all the samples from 1-1 to 1-169, no Al-Ti film was deposited at all at the opening having the electron non-donative second substrate exposed, but Al-Ti of about 7000 Å was deposited only on the electron donative first substrate, whereby complete selectivity was obtained. The film quality of the Al-Ti film deposited was found to be very good, exhibiting the same properties as one prepared at a substrate temperature of 300° C. in Example 12.

EXAMPLE 16

When deposition was carried out according to the same procedure as shown in Example 12 by use of $MMAH_2$ as the starting gas and setting the conditions as follows:

Total pressure: 1.5 Torr
$MMAH_2$ partial pressure: $5 \times 10^{-4}$ Torr
$TiCl_4$ partial pressure: $1.5 \times 10^{-6}$ Torr in the temperature range of the substrate temperature from 160° C. to 400° C., an Al-Ti thin film containing no carbon impurity and having excellent flatness, denseness and selectivity depending on the substrate surface materials was deposited similarly as in Example 12.

EXAMPLE 17

First, the procedure for Al-Si-Ti film formation is as follows. By use of the device shown in FIG. 1, the reaction tube 2 is internally evacuated to ca. $1 \times 10^{-8}$ Torr by the evacuation unit 9. However, Al-Si-Ti film can be also formed if the vacuum degree within the reaction tube 2 may be worse than $1 \times 10^{-8}$ Torr.

After washing of Si wafer, the conveying chamber 10 is released to atmospheric pressure and Si wafer is mounted in the conveying chamber. The conveying chamber is evacuated to ca. $10^{-6}$ Torr, and then the gate valve 13 is opened and the wafer is mounted on the wafer holder 3.

After mounting of the wafer on the wafer holder 3, the gate valve 13 is closed, and the reaction chamber 2 is evacuated to a vacuum degree of ca. $1 \times 10^{-8}$ Torr.

In this Example, DMAH is fed through the first gas line. As the carrier gas of DMAH line, $H_2$ is employed. The second gas line is used for $H_2$ and the third gas line for $TiCl_4$ diluted with $H_2$. The fourth gas line is provided for $Si_2H_6$. The third gas line, the mixer and the reaction tube are preheated to 180° C. ±10° C.

By passing $H_2$ through the second gas line, the pressure within the reaction tube 2 is made a predetermined value by controlling the opening of the slow leak valve 8. A typical pressure in this Example is made approximately 1.5 Torr. Then, the wafer is heated by current passage through the heater 4. After the wafer temperature has reached a predetermined temperature, DMAH, $TiCl_4$ and $Si_2H_6$ are introduced into the reaction tube through the DMAH line, the $TiCl_4$ line and the $Si_2H_6$ line. The total pressure is ca. 1.5 Torr, and the DMAH partial pressure is made ca. $1.5 \times 10^{-4}$ Torr. The $TiCl_4$ partial pressure is made $1 \times 10^{-6}$ Torr and the $Si_2H_6$ partial pressure is made $1 \times 10^{-5}$ Torr. When $Si_2H_6$ and DMAH are introduced into the reaction tube 2, Al-Si-Ti is deposited. After a predetermined deposition time has elapsed, feeding of DMAH, $TiCl_4$ and $Si_2H_6$ is stopped. Next, heating of the heater 4 is stopped to cool the wafer. Feeding of $H_2$ gas is stopped, and after evacuation internally of the reaction tube, the wafer is transferred to the conveying chamber, and only the conveying chamber is made atmospheric before taking out the wafer. The outline of Al-Si-Ti film formation is as described above.

Next, preparation of samples in this Example is explained below.

Si substrates (N type 1–2 ohm·cm) were subjected to thermal oxidation at a temperature of 1000° C. according to the hydrogen combustion system ($H_2$: 3 liters/M, $O_2$: 2 liters/M).

The wafers having an oxide film were provided to deposit Al-Si-Ti films of 5000 Å thickness following the above described procedure under the following conditions.

Total pressure: 1.5 Torr
DMAH partial pressure: $1.5 \times 10^{-4}$ Torr
$TiCl_4$ partial pressure: $1 \times 10^{-6}$ Torr
$Si_2H_6$ partial pressure: $1 \times 10^{-5}$ Torr The Al-Si-Ti films thus formed were subjected to patterning according to conventional photolithographic technique to obtain test samples in which Al-Si-Ti remained in the widths of 2, 4 and 6 µm.

When the temperature (Ts) of substrate for deposition was varied to evaluate the characteristics of the deposited films, substantially the same results as those shown in Table 2 were obtained.

EXAMPLE 18

By means of the low pressure CVD apparatus shown in FIG. 2, Al-Si-Ti films were formed on the substrates with the constitutions as described below.

On a monocrystalline silicon as the electron donative first substrate surface material, a thermally oxidized $SiO_2$ film as the electron non-donative second substrate surface material was formed, and patterning was effected according to the photolithographic steps to have the monocrystalline silicon surface partially exposed.

The film thickness of the thermally oxidized $SiO_2$ film was found to be 7000 Å, with the size of the exposed portion of the monocrystalline silicon, namely opening being 3 µm × 3 µm. Thus a sample was prepared. (Hereinafter, such sample is expressed as "thermally oxidized $SiO_2$ (hereinafter abbreviated as T-$SiO_2$)/monocrystalline silicon)".

Following the same procedure as described above, samples were prepared as follows.

Oxidized film formed by normal pressure CVD (hereinafter abbreviated as $SiO_2$)/monocrystalline silicon.

Phosphorus doped oxidized film formed by normal pressure CVD (hereinafter abbreviated as PSG)/monocrystalline silicon.

Phosphorus and boron doped oxidized film formed by normal pressure CVD (hereinafter abbreviated as BSPG)/monocrystalline silicon formed by normal pressure CVD.

These samples and $Al_2O_3$ substrate, $SiO_2$ glass substrates were placed in the low pressure CVD device shown in Table 2, and Al-Si-Ti films were formed within the same badge. The film forming conditions were a reaction tube pressure of 0.3 Torr, a DMAH partial pressure of $3.0 \times 10^{-5}$ Torr, a $TiCl_4$ partial pressure of $1 \times 10^{-7}$ Torr, a $Si_2H_6$ partial pressure of $1 \times 10^{-6}$ Torr, a substrate temperature of 300° C. and film formation time of 10 minutes.

As the result of film formation under such conditions, concerning all the samples applied with patterning, deposition of Al-Si-Ti film occurred only on the electron donative. Si substrate surface film to embed completely the opening with the depth of 7000 Å. The film quality of the Al-Si-Ti film was found to be very good, exhibiting the same properties as one prepared at a substrate temperature of 300° C. shown in Example 12.

On the other hand, on the second substrate surface which is electron non-donative, no Al-Si-Ti film was deposited at all, whereby complete selectivity was obtained. On both the $Al_2O_3$ substrate and the $SiO_2$ glass substrate which are electron non-donative, no Al-Si-Ti film was deposited at all.

EXAMPLE 19

Following the same procedure as in Example 17 to set the parameters as follows:
Total pressure: 1.5 Torr
DMAH partial pressure: $5 \times 10^{-4}$ Torr
$Si_2H_6$ partial pressure: $1 \times 10^{-5}$ Torr
Substrate temperature (Tsub): 300° C.
and the $TiCl_4$ partial pressure was varied from $5 \times 10^{-7}$ Torr to $1 \times 10^{-4}$ Torr to effect deposition. The Ti content (wt. %) of the Al-Si-Ti films were varied from 0.3% to 4%. As to resistivity, carbon content, average wiring life, deposition speed, and hillock density, the same results as in Example 12 were obtained. Similarly as in Example 13, selective depositability depending on substrate surface material was also confirmed over the entire region.

EXAMPLE 20

Following the same procedure as in Example 17 to set the parameters as follows:
Total pressure: 1.5 Torr
DMAH partial pressure: $5 \times 10^{-4}$ Torr
$TiCl_4$ partial pressure: $1 \times 10^{-6}$ Torr
Substrate temperature (Tsub): 300° C.
and the $Si_2H_6$ partial pressure was varied from $1.5 \times 10^{-7}$ Torr to $1 \times 10^{-4}$ Torr to effect deposition. The Si content (wt. %) of the Al-Si-Ti films were varied from 0.005% to 5% approximately in proportion to the $Si_2H_6$ partial pressure. As to resistivity, average wiring life, deposition speed and hillock density, the same results as in Example 12 were obtained. However, in samples having a Si content of 4% or higher, deposition was generated in the films which appeared to be Si to worsen surface morphology, thereby making the reflectance 60% or lower. Samples having a Si content of less than 4% exhibited a reflectance of 80 to 95%, which was the same as in Example 17. Furthermore, selective depositability depending on substrate surface material was confirmed over the entire region.

EXAMPLE 21

The procedure of Example 17 was repeated to deposit Al-Si-Ti with the exception that the parameters were set as follows:
Total pressure: 1.5 Torr
DMAH partial pressure: $5 \times 10^{-4}$ Torr
$Si_2H_6$ partial pressure: $1 \times 10^{-5}$ Torr
$TiCl_4$ partial pressure: $1 \times 10^{-6}$ Torr
As a result, Al-Si-Ti films were deposited within the substrate temperature range of 160° C. to 400° C. which were excellent in migration resistance, flatness, denseness and selectivity depending on substrate surface material similarly as in Example 12.

In the following, description is made of Examples in which Al-Cu or Al-Si-Cu is deposited by use of Cu in place of Ti as the additive.

EXAMPLE 22

By the evacuation unit 9 of the device shown in FIG. 1, the reaction tube 2 is internally evacuated to ca. $1 \times 10^{-8}$ Torr.

However, film deposition of Al-Si-Cu is possible even when the vacuum degree within the reaction tube 2 may be worse than $1 \times 10^{-8}$ Torr (e.g. $1 \times 10^{-7}$ or $1 \times 10^{-6}$).

After washing of Si wafer, the conveying chamber 10 is released to atmospheric pressure and Si wafer is mounted in the conveying chamber. The conveying chamber is evacuated to ca. $1 \times 10^{-6}$ Torr, and then the gate valve 13 is opened and the wafer is mounted on the wafer holder 3.

After mounting of the wafer on the wafer holder 3, the gate valve 13 is closed, and the reaction chamber 2 is evacuated to a vacuum degree of ca. $1 \times 10^{-8}$ Torr.

In this Example, DMAH is fed through the first gas line. As the carrier gas of DMAH line $H_2$ is employed. The second gas line is used for $H_2$, the third gas line for $Cu(C_5H_7O_2)_2$, and the fourth gas line for $Si_2H_6$. The third gas line, the mixer and the reaction tube are preliminarily heated to 180° C.±10° C.

By passing $H_2$ through the second gas line, the pressure within the reaction tube 2 is made a predetermined value by controlling the opening of the slow leak valve 8. A typical pressure in this Example is made approximately 1.5 Torr. Then, the wafer is heated by current passage through the heater 4. After the wafer temperature has reached a predetermined temperature, DMAH, $Cu(C_5H_7O_2)_2$ and $Si_2H_6$ are introduced into the reaction tube through the DMAH line, the $Cu(C_5H_7O_2)_2$ line and the $Si_2H_6$ line. The total pressure is ca. 1.5 Torr, and the DMAH partial pressure is made ca. $1.5 \times 10^{-4}$ Torr. The $Cu(C_5H_7O_2)_2$ partial pressure is made $1 \times 10^{-6}$ Torr, and the $Si_2H_6$ partial pressure is made $1 \times 10^{-5}$ Torr. When $Si_2H_6$ and DMAH are introduced into the reaction tube 2, Al-Si-Cu is deposited. After a predetermined deposition time has elapsed, feeding of DMAH, $Cu(C_2H_7O_2)_2$ and $Si_2H_6$ is stopped. Next, heating of the heater 4 is stopped to cool the wafer. Feeding of $H_2$ gas is stopped, and after evacuation internally of the reaction tube, the wafer is transferred to the conveying chamber, and only the conveying chamber is made atmospheric before taking out the wafer. The outline of Al-Si-Cu film formation is as described above.

Next, preparation of samples in this Example will be explained below.

Si substrates (N type, 1–2 ohm-cm) were subjected to thermal oxidation at a temperature of 1000° C. according to the hydrogen combustion system ($H_2$: 3 liters/M, $O_2$: 2 liters/M).

The wafer with the oxidized film was prepared, and an Al-Si-Cu film of 5000 Å was deposited by following the above-mentioned procedure under the following conditions:
Total pressure: 1.5 Torr
DMAH partial pressure: $1.5 \times 10^{-4}$ Torr
$Cu(C_5H_7O_2)_2$ partial pressure: $1 \times 10^{-6}$ Torr
$Si_2H_6$ partial pressure: $1 \times 10^{-5}$ Torr.

By using the conventional photolithographic technique, patterning was carried out so that the Al-Si-Cu might remain in widths of 2, 4 and 6 μm.

The results of evaluation of the films deposited by changing the temperature of deposition substrate (Ts) and of the cases in which the wiring width of Al-Si-Cu was varied are shown in Table 5.

In the above-mentioned sample, within the temperature range of 220° C. to 400° C., films could be obtained which had very few hillocks and were excellent in the electro-migration resistance.

Also, the patterning property of the present Al-Si-Cu was extremely good.

EXAMPLE 23

The procedure of Example 22 was repeated by using the device as shown in FIG. 2 to effect deposition Al-Si-Cu under the following conditions:
Total pressure: 1.5 Torr
DMAH partial pressure: $5 \times 10^{-4}$ Torr
$Si_2H_6$ partial pressure: $1 \times 10^{-5}$ Torr
$Cu(C_5H_7O_2)_2$ partial pressure: $1 \times 10^{-6}$ Torr
Substrate temperature: 300° C.

As a result, Al-Si-Cu films could be obtained which were excellent in migration resistance, flatness and denseness similarly as in Example 22.

EXAMPLE 24

Following the same procedure as in Example 22 to set the parameters as follows:
Total pressure: 1.5 Torr
DMAH partial pressure: $5 \times 10^{-4}$ Torr
$Si_2H_6$ partial pressure: $1 \times 10^{-5}$ Torr
Substrate temperature (Tsub): 300° C.
and the $Cu(C_5H_7O_2)_2$ partial pressure was varied from $5 \times 10^{-7}$ Torr to $1 \times 10^{-4}$ Torr to effect deposition. The Cu content (wt. %) of the Al-Si-Cu films were varied from 0.3% to 4% depending on the $Cu(C_5H_7O_2)_2$ partial pressure. As to resistivity, carbon content, average wiring life, deposition speed, and hillock density, the same results as in Example 22 were obtained. However, the samples having a Cu content of 3% or higher had high probability that the surface morphology was slightly worsened.

EXAMPLE 25

Following the same procedure as in Example 22 to set the parameters as follows:
Total pressure: 1.5 Torr
DMAH partial pressure: $5 \times 10^{-4}$ Torr
$Cu(C_5H_7O_2)_2$ partial pressure: $1 \times 10^{-6}$ Torr
Substrate temperature (Tsub): 300° C.
and the $Si_2H_6$ partial pressure was varied from $1.5 \times 10^{-7}$ Torr to $1 \times 10^{-4}$ Torr to effect deposition. The Si content (wt. %) of the Al-Si-Cu films were varied from 0.005% to 5% depending on the $Si_2H_6$ partial pressure. As to resistivity, average wiring life, deposition speed, and hillock density, the same results as in Example 22 were obtained. However, in samples having a Si content of 4% or higher, deposition was generated in the films which appeared to be Si to slightly worsen surface morphology, thereby making the reflectance 65% or lower. Samples having a Si content of less than 4% exhibited a reflectance of 80 to 95%, which was the same as in Example 22.

EXAMPLE 26

Following the same procedure as in Example 22 to set the parameters as follows:
Total pressure: 1.5 Torr
DMAH partial pressure: $5 \times 10^{-4}$ Torr
$Cu(C_5H_7O_2)_2$ partial pressure: $1 \times 10^{-6}$ Torr
Substrate temperature: 300° C.
and the deposition was effected without flowing $Si_2H_6$. The Cu content in the formed Al-Cu film was 0.5%, and evaluation of the electro-migration resistance was excellent as compared with Example 22.

EXAMPLE 27

Following the same procedure as in Example 22 to set the parameters as follows:
Total pressure: 1.5 Torr
DMAH partial pressure: $5 \times 10^{-4}$ Torr
$Si_2H_6$ partial pressure: $1 \times 10^{-5}$ Torr
$Cu(C_{11}H_{19}O_2)_2$ partial pressure: $1 \times 10^{-6}$ Torr
and deposition of Al-Si-Cu was effected.

Within the substrate temperature range of 220° C.–400° C., Al-Si-Cu films could be obtained which were excellent in the migration resistance, flatness and denseness similarly as in Example 22.

EXAMPLE 28

Following the same procedure as in Example 22 to set the parameters as follows:
Total pressure: 1.5 Torr
DMAH partial pressure: $5 \times 10^{-4}$ Torr
$Si_2H_6$ partial pressure: $1 \times 10^{-5}$ Torr
$Cu(C_5HF_6O_2)_2$ partial pressure: $1 \times 10^{-6}$ Torr
and deposition of Al-Si-Cu was effected.

Within the substrate temperature range of 220° C.–400° C., Al-Si-Cu films could be obtained which were excellent in the migration resistance, flatness and denseness similarly as in Example 22.

EXAMPLE 29

By means of the reduced pressure CVD device shown in FIG. 2, Al-Si-Cu films were formed in same manner as in Example 23 on the substrates with the constitution as described below.

On a monocrystalline silicon surface in which phosphorus of $10^{20}$ cm$^{-3}$ was selectively diffused, a thermally oxidized $SiO_2$ film was formed, and patterning was effected according to the conventional photolithographic steps to have the monocrystalline silicon surface partially exposed.

The film thickness of the thermally oxidized $SiO_2$ film was found to be 7000 Å, with the size of the exposed portion of the monocrystalline silicon, namely opening being 0.8 μm × 0.8 μm. Thus, samples were prepared.

These samples were placed in the reduced pressure CVD device shown in Table 2, and Al-Si-Cu films were formed within the same batch. The film forming conditions were a reaction tube pressure of 0.3 Torr, a DMAH partial pressure of $3.0 \times 10^{-5}$ Torr, a $Si_2H_6$ partial pressure of $1.0 \times 10^{-6}$ Torr, a $Cu(C_5H_7O_2)_2$ partial pressure of $1 \times 10^{-7}$ Torr, a substrate temperature of 300° C. and a film formation time of 10 minutes.

As the result of the film formation under such conditions, the contact resistance between the phosphorus diffused region of silicon and the deposited Al-Si-Cu film was $8 \times 10^{-7}$ to $1.2 \times 10^{-6}$ ohm cm$^2$. In short, the inside of the via-hole could be filled up with the deposited Al-Si-Cu, without providing any barrier metal or the like in the via-hole, and good contact resistance and excellent resistance in the hole could be obtained.

EXAMPLE 30

First, the procedure for Al-Si-Cu film formation is as follows. By use of the device shown in FIG. 1, the reaction tube 2 is internally evacuated to ca. $1 \times 10^{-8}$ Torr by the evacuation unit 9. However, Al-Si-Cu film can also be formed if the vacuum degree within the reaction tube 2 may be worse than $1 \times 10^{-8}$ Torr.

After washing the Si wafer, the conveying chamber 10 is released to atmospheric pressure and the Si wafer is mounted in the conveying chamber. The conveying chamber is evacuated to ca. $1 \times 10^{-6}$ Torr, and then the gate valve 13 is opened and the wafer is mounted on the wafer holder 3.

After mounting of the wafer on the wafer holder 3, the gate valve 13 is closed, and the reaction chamber 2 is evacuated to a vacuum degree of ca. $1 \times 10^{-8}$ Torr.

In this Example, DMAH is fed through the first gas line. As the carrier gas of DMAH line $H_2$ is employed. The second gas line is used for $H_2$, the third gas line for $Cu(C_5H_7O_2)_2$ and the fourth gas line for $Si_2H_6$. The third gas line, the mixer, and the reaction tube were preliminarily heated to 180° C.±10° C.

By passing $H_2$ through the second gas line, the pressure within the reaction tube 2 is made a predetermined value by controlling the opening of the slow leak valve 8. A typical pressure in this Example is made approximately 1.5 Torr. Then, the wafer is heated by current passage through the heater 4. After the wafer temperature has reached a predetermined temperature, DMAH, $Cu(C_5H_7O_2)_2$ and $Si_2H_6$ are introduced into the reaction tube through the DMAH line, the $Cu(C_5H_7O_2)_2$ line and the $Si_2H_6$ line. The total pressure is ca. 1.5 Torr, and the DMAH partial pressure is made ca. $1.5 \times 10^{-4}$ Torr. The $Cu(C_5H_7O_2)_2$ partial pressure is made $1 \times 10^{-6}$ Torr, and the $Si_2H_6$ partial pressure is made $1 \times 10^{-5}$ Torr. When $Si_2H_6$ and DMAH are introduced into the reaction tube 2, Al-Si-Cu is deposited. After a predetermined deposition time has elapsed, feeding of DMAH, $Cu(C_5H_7O_2)_2$ and $Si_2H_6$ is stopped. Next, heating of the heater 4 is stopped to cool the wafer. Feeding of $H_2$ gas is stopped, and after evacuation internally of the reaction tube, the wafer is transferred to the conveying chamber, and only the conveying chamber is made atmospheric before taking out the wafer. The outline of Al-Si-Cu film formation is as described above.

Preparation of a sample in this Example will be explained below.

Si substrates (N type, 1-2 ohm-cm) were subjected to thermal oxidation at a temperature of 1000° C. according to the hydrogen combustion system ($H_2$: 3 liters/M, $O_2$: 2 liters/M).

The wafer with the oxidized film was prepared, and Al-Si-Cu film of 5000 Å was deposited by following the above-mentioned procedure under the following conditions:

Total pressure: 1.5 Torr
DMAH partial pressure: $1.5 \times 10^{-4}$ Torr
$Cu(C_5H_7O_2)_2$ partial pressure: $1 \times 10^{-6}$ Torr
$Si_2H_6$ partial pressure: $1 \times 10^{-5}$ Torr By using the conventional photolithographic technique, patterning was effected so that the Al-Si-Cu might remain in widths of 2, 4 and 6 μm.

The results of evaluation of the films deposited by changing the temperature of deposition substrate (Ts) and of the cases in which the wiring width of Al-Si-Cu was varied are shown in Table 6.

Within the temperature range of 220° C.–400° C., films could be obtained which had very few hillocks and were excellent in the electro-migration resistance.

Also, the patterning property of the present Al-Si-Cu was extremely good.

EXAMPLE 31

By means of the reduced pressure CVD device shown in FIG. 2, Al-Si-Cu films were formed on the substrates with the constitution as described below.

On a monocrystalline silicon as the electron donative first substrate surface material, a thermally oxidized $SiO_2$ film as the electron non-donative second substrate surface material was formed, and patterning was effected according to the photolithographic steps to have the monocrystalline silicon surface partially exposed.

The film thickness of the thermally oxidized $SiO_2$ film was found to be 7000 Å, with the size of the exposed portion of the monocrystalline silicon, namely opening being 3 μm×3 μm. Thus, a sample was prepared. (Hereinafter, such sample is expressed as "thermally oxidized $SiO_2$ (hereinafter abbreviated T-$SiO_2$)/monocrystalline silicon").

Similarly, the following samples were prepared:

an oxidized film formed by normal pressure CVD (hereinafter abbreviated as $SiO_2$)/monocrystalline silicon, a phosphorus doped oxidized film formed by normal pressure CVD (hereinafter abbreviated as PSG)/monocrystalline silicon, and a phosphorus and boron doped oxidized film formed by normal pressure CVD (hereinafter abbreviated as BSPG)/monocrystalline silicon.

These samples and $Al_2O_3$ substrates, $SiO_2$ glass substrates were placed in the reduced pressure CVD device shown in Table 2, and Al-Si-Cu films were formed within the same batch. The film forming conditions were a reaction tube pressure of 0.3 Torr, a DMAH partial pressure of $3 \times 10^{-5}$ Torr, a $Cu(C_5H_7O_2)_2$ partial pressure of $1 \times 10^{-7}$ Torr, a $Si_2H_6$ partial pressure of $1 \times 10^{-6}$ Torr, a substrate temperature of 300° C. and a film formation time of 10 minutes.

As the result of film formation under such conditions, concerning all the samples applied with patterning, deposition of Al-Si-Cu film occurred only on the electron donative Si substrate surface film to embed completely the opening with the depth of 7000 Å. The film quality of the Al-Si-Cu film was found to be very good, exhibiting the same properties as one prepared at a substrate temperature of 300° C. shown in Example 30. On the other hand, on the second substrate surface which is electron non-donative, no Al-Si-Cu film was deposited at all, whereby complete selectivity was obtained. On both the $Al_2O_3$ substrate and the $SiO_2$ glass substrate which are electron non-donative, no Al-Si-Cu film was deposited at all.

EXAMPLE 32

Following the same procedure as in Example 30 to set the parameters as follows:

Total pressure: 1.5 Torr
DMAH partial pressure: $5 \times 10^{-4}$ Torr
$Si_2H_6$ partial pressure: $1 \times 10^{-5}$ Torr
Substrate temperature (Tsub): 300° C.

and the $Cu(C_5H_7O_2)_2$ partial pressure was varied from $5 \times 10^{-7}$ Torr to $1 \times 10^{-4}$ Torr to effect deposition. The Cu content (wt. %) of the Al-Si-Cu films were varied from 0.3% to 4% depending on the $Cu(C_5H_7O_2)_2$ partial pressure. As to resistivity, carbon content, average wiring life, deposition speed, and hillock density, the same results as in Example 30 were obtained. However, in samples having a Cu content of 3% or higher, the surface morphology was worsened. Similarly to Example 31, the deposition selectivity depending on the substrate surface material was confirmed over the entire region.

EXAMPLE 33

Following the same procedure as in Example 30 to set the parameters as follows:

Total pressure: 1.5 Torr
DMAH partial pressure: $5 \times 10^{-4}$ Torr $Cu(C_5H_7O_2)_2$ partial pressure: $1 \times 10^{-6}$ Torr
Substrate temperature (Tsub): 300° C.
and the $Si_2H_6$ partial pressure was varied from $1.5 \times 10^{-7}$ Torr to $1 \times 10^{-4}$ Torr to effect deposition. The Si content (wt. %) of the Al-Si-Cu films were varied from 0.005% to 5% approximately in proportion to the $Si_2H_6$ partial pressure. As to resistivity, average wiring life, deposition speed, and hillock density, the same results as in Example 30 were obtained. However, in samples having a Si content of 4% or higher, deposition was generated in the films which appeared to be Si to worsen surface morphology, thereby making the reflectance 65% or lower. Samples having a Si content of less than 4% exhibited a reflectance of 80 to 95%, which was the same as in Example 30. Similarly to Example 31, the selective depositability depending on the substrate surface material was confirmed over the entire region.

EXAMPLE 34

Following the same procedure as in Example 30 to set the parameters as follows:
Total pressure: 1.5 Torr
DMAH partial pressure: $5 \times 10^{-4}$ Torr
$Cu(C_5H_7O_2)_2$ partial pressure: $1 \times 10^{-6}$ Torr
Substrate temperature: 300° C.
and the deposition was effected without flowing $Si_2H_6$. The Cu content in the formed Al-Cu film was 0.5%, and evaluation of the electro-migration resistance was excellent as compared with Example 30.

Also, the selective depositability depending on the substrate surface material was confirmed similarly as in Example 30.

EXAMPLE 35

Following the same procedure as in Example 30 to set the parameters as follows:
Total pressure: 1.5 Torr
DMAH partial pressure: $5 \times 10^{-4}$ Torr
$Si_2H_6$ partial pressure: $1 \times 10^{-5}$ Torr
$Cu(C_{11}H_{19}O_2)_2$ partial pressure: $1 \times 10^{-6}$ Torr
and deposition of Al-Si-Cu was effected.

Within the substrate temperature range of 220° C.-400° C., Al-Si-Cu films could be obtained which were excellent in the migration resistance, flatness, denseness and selectivity depending on substrate surface material similarly as in Example 30.

EXAMPLE 36

Following the same procedure as in Example 30 to set the parameters as follows:
Total pressure: 1.5 Torr
DMAH partial pressure: $5 \times 10^{-4}$ Torr
$Si_2H_6$ partial pressure: $1 \times 10^{-5}$ Torr
$Cu(C_5HF_6O_2)_2$ partial pressure: $1 \times 10^{-6}$ Torr
and deposition of Al-Si-Cu was effected.

Within the substrate temperature range of 220° C.-400° C., Al-Si-Cu films could be obtained which were excellent in the migration resistance, flatness, denseness, and selectivity similarly as in Example 30.

EXAMPLE 37

By means of the reduced pressure CVD device shown in FIG. 2, Al-Si-Cu films were formed in the same manner as in Example 31 on the substrates with the constitution as described below.

In a monocrystalline silicon as the electron donative first substrate surface material, phosphorus of $10^{20}$ $cm^{-3}$ was selectively diffused, and a thermally oxidized $SiO_2$ film as the electron non-donative second substrate surface material was formed thereon, and patterning was effected according to the conventional photolithographic steps to have the monocrystalline silicon surface partially exposed.

The film thickness of the thermally oxidized $SiO_2$ film was found to be 7000 Å, with the size of the exposed portion of the monocrystalline silicon, namely opening being 0.8 μm × 0.8 μm. Thus, samples were prepared.

These samples were placed in the reduced pressure CVD device shown in Table 2, and Al-Si-Cu films were formed within the same batch. The film forming conditions were a reaction tube pressure of 0.3 Torr, a DMAH partial pressure of $3 \times 10^{-5}$ Torr, a $Si_2H_6$ partial pressure of $1 \times 10^{-6}$ Torr, a $Cu(C_5H_7O_2)_2$ partial pressure of $1 \times 10^{-7}$ Torr, a substrate temperature of 300° C. and a film formation time of 10 minutes.

As the result of the film formation under such conditions, concerning all the samples applied with patterning, deposition of Al-Si-Cu film occurred only on the electron donative silicon substrate surface to embed completely the opening with the depth of 7000 Å. The film quality of the Al-Si-Cu film was found to be very good, exhibiting the same properties as one prepared at a substrate temperature of 300° C. shown in Example 30. On the other hand, on the oxidized film surface which is electron non-donative, no Al-Si-Cu film was deposited at all, whereby complete selectivity was obtained.

Further, the contact resistance between the phosphorus-diffused region of silicon and the deposited Al-Si-Cu film was $8 \times 10^{-7}$ to $1.2 \times 10^{-6}$ ohm·$cm^2$. The inside of the via-hole could be filled up with the Al-Si-Cu deposited, without providing any barrier metal or the like in the inside of the via-hole, and good contact resistance and excellent resistance within the hole could be obtained.

Next, an application example utilizing each example as mentioned above for formation of electrodes of a semiconductor device will be explained.

As an example for forming source-drain electrodes of gate insulation type transistor, electrode formation within the contact hole on the source-drain was carried out by use of the film formation method according to the present invention. This is described by referring to FIGS. 4A-4E.

Figure 4A:
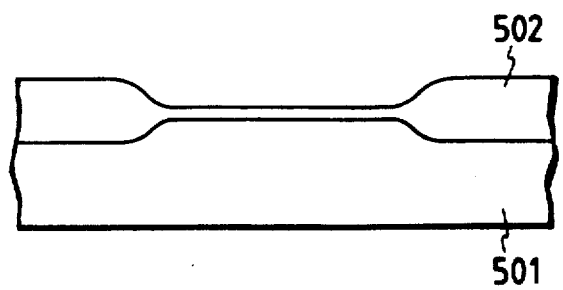
FIGS. 4A–4E are illustrations for explaining formation of source and drain electrodes in contact holes of a gate insulation type transistor.

First, on a p-type silicon wafer 501, by use of conventional selective oxidation method, etc. a thick field oxidized film and a thin thermally oxidized film 502 were formed on the wafer 501 (FIG. 4A).

Figure 4B:
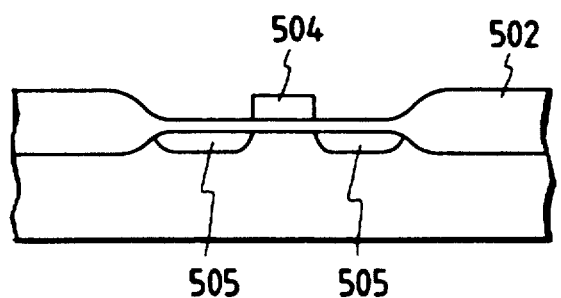

Next, with the use of $SiH_4$ gas as the starting gas, a polycrystalline silicon layer was formed by the thermal CVD method, a polycrystalline silicon gate electrode 504 was formed, and also with the thick field oxidized film and the gate electrode 504 as the mask, phosphorus was ion injected self-matchingly to form an impurity diffused region 505 of $1 \times 10^{-8}$ $cm^{-3}$ (FIG. 4B).

Figure 4C:
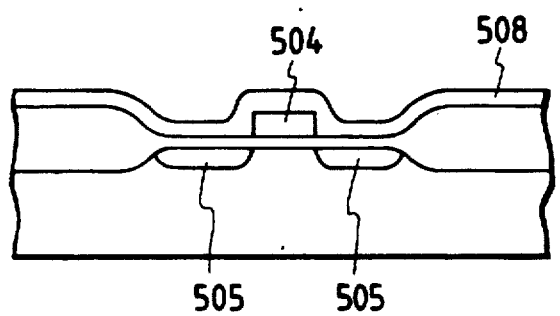

Next, an oxidized silicon film 508 was formed by use of the thermal CVD method (FIG. 4C).

Figure 4D:
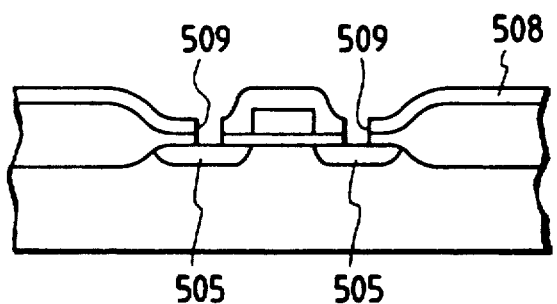

By use of the lithographic method, a contact hole 509 with a size of 0.5 μm × 0.5 μm was formed (FIG. 4D).

By transferring the substrate thus obtained to the device shown in FIG. 1, Al film was formed.

At this time, the substrate temperature was made 270° C., and DMAH was employed as the starting gas, $H_2$ as the carrier gas, and $TiCl_4$ as the additive gas to carry out formation of Al film.

Figure 4E:
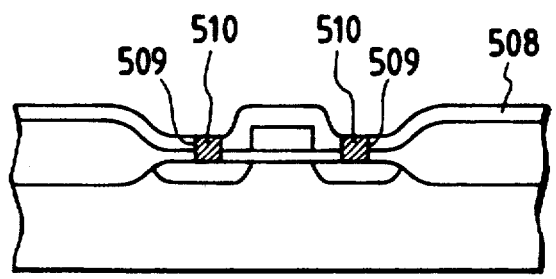

After completion of formation of Al film, the transistor was taken out from the film forming device and observed. As the result, it was found that Al film 510 was deposited only on the Si 505 wherein phosphorus was diffused in the contact hole 509, and not deposited on the oxidized film 508 (FIG. 4E). Further, the surface of the Al film 510 was very flat. When the characteristics of the transistor obtained were examined, extremely good characteristics were exhibited.

Separately, according to the same steps, the substrate was made N type, and the impurity was changed from phosphorus to boron to prepare P channel MOS.

Comparative experiment

An Al film was formed on a monocrystalline silicon under the following conditions.

By passing Ar in place of $H_2$, Al was deposited by pyrolysis of DMAH. The total pressure at this time was made 1.5 Torr, the DMAH partial pressure $1.5 \times 10^{-4}$ Torr, and the substrate temperature of 270–350° C.

When the Al film thus formed was evaluated, about 2% of carbon was found to be contained at the minimum.

Resistivity became greater by 2-fold or more than the case when hydrogen was employed.

As to reflectance, it was lowered to about ⅓ to 1/9 relative the case when hydrogen was employed.

Similarly, wiring life was shorter by 1 to 2 cipher, generation probability of hillock became greater by 2 cipher or more, and a large number of spikes were found to be generated.

As to the deposition speed, it was lowered to ½ to ¼.

As described above, Al deposited only by decomposition of DMAH without use of $H_2$ is inferior in film quality, and was unsatisfactory as the Al film for a semiconductor device.

Separately, without use of $H_2$, DMAH was decomposed by the optical CVD method to deposit Al. As the result, some improvement such as no containment of carbon, and the like was observed from as the Al film prepared as compared with the case when no light was employed, but other characteristics were not improved so much, and the Al film was still unsatisfactory as the Al film for a semiconductor device.

As described above, the mechanism of Al deposition according to the present invention may be presently hypothesized as follows.

Figure 5A:
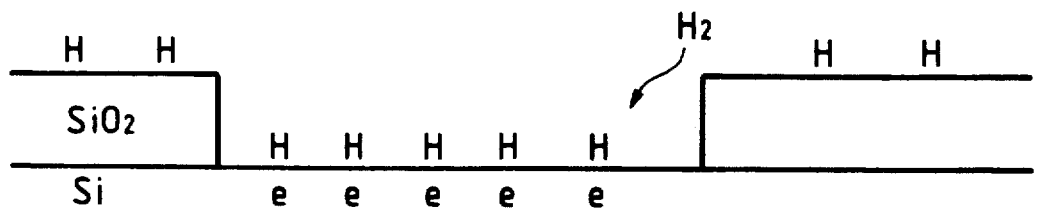
FIGS. 5A–5D are illustrations for explaining the mechanism of Al deposition according to the present invention.
Figure 5B:
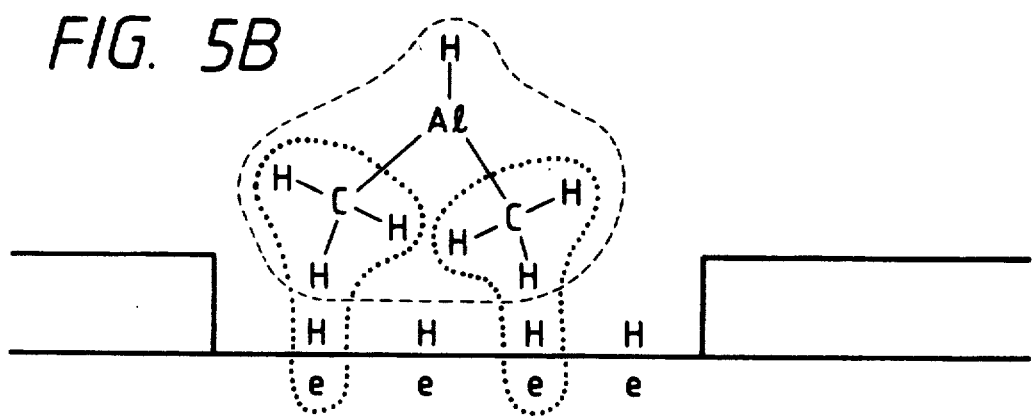
Figure 5C:
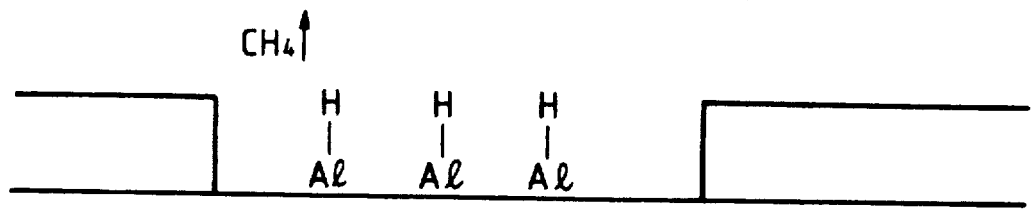

When DMAH reaches the electron donative substrate, namely the substrate having electrons under the state on which hydrogen atoms are attached (FIG. 5A) with the methyl groups directed toward the substrate side, one electron of the substrate cuts one bond of Al and a methyl group (FIGS. 5B and 5C).

The reaction scheme at this time is as follows:

$$(CH_3)_2AlH + 2H + 2e \rightarrow 2CH_4 \uparrow + Al\text{-}H$$

Figure 5D:
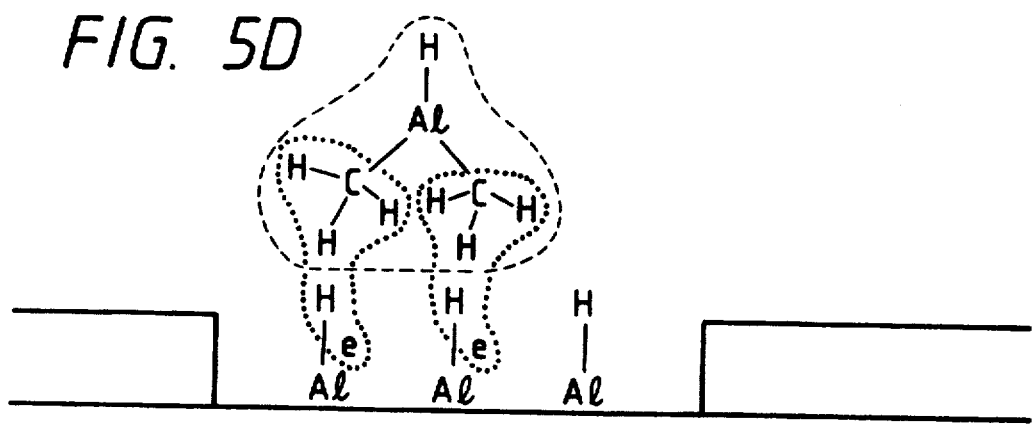

Further, similar reactions will proceed for the hydrogen atoms remaining on deposited Al having free electrons (FIG. 5D). Here, when hydrogen atoms are deficient, hydrogen molecules constituting the reaction gas are decomposed on the substrate to supply hydrogen atoms. On the other hand, since there is no electron on the electron non-donative surface, the above-mentioned reaction will not proceed and no Al deposited.

FIGS. 5A–5D are illustrations for better understanding of the reaction mechanism, and the numbers of H, e and Al shown in FIGS. 5A–5D are not necessarily coincident.

In the case of Al-Ti, Al-Si-Ti, Al-Cu, and Al-Si-Cu films, Ti, Cu and Si atoms are incorporated into Al during the process of the reaction as described above.

As described above, according to the present invention, a low resistivity, dense and flat additive-containing Al film could be deposited on a substrate.

Also, depending on the kind of the substrate, additive-containing Al can be formed with excellent selectivity.

As explained in the foregoing, according to the present invention, low resistance, dense and flat Al films containing an additive such as Al-Ti, Al-Si-Ti, Al-Si-Cu and Al-Cu films can be deposited on a substrate. Also, if necessary, good selective deposition can be carried out.

TABLE 1

| Evaluation means | Substrate temperature Ts | | | | |
|---|---|---|---|---|---|
| | 150° C. | 160° C. | 200° C. 250° C. 270° C. 300° C. 330° C. 350° C. 370° C. 400° C. | 430° C. 450° C. | 470° C. |
| Carbon Content | Not deposited | ← | Lower than detection limit | → | several % contained |
| Resistivity | ← | | $3 \sim 6\ \mu\Omega cm$ | | → |
| Reflectance | ← | | 80~90% | ⟩⟨ 65~80% ⟩⟨ | 60% ↓ → |
| Average wiring life | ← | | $1 \times 10^3 \sim 5 \times 10^4$ hrs. | ⟩⟨ $10^3$ hrs. | → |
| Deposition speed | several Å/min. ⟩⟨ | | 100~800 Å/min. | | ⟩⟨ 1000 Å/min. → |
| Hillock density | ← $0 \sim 10^3\ cm^{-2}$ ⟩⟨ | | $0 \sim 10\ cm^{-2}$ | ⟩⟨ | $0 \sim 10^4\ cm^{-2}$ → |
| Spike generation ratio | ← 0~15% ⟩⟨ | | ~0% | ⟩⟨ | 35% → |

TABLE 1-continued

| Evaluation means | Substrate temperature Ts | | | | | | | | | | | |
|---|---|---|---|---|---|---|---|---|---|---|---|---|
| | 150° C. | 160° C. | 200° C. | 250° C. | 270° C. | 300° C. | 330° C. | 350° C. | 370° C. | 400° C. | 430° C. | 450° C. | 470° C. |

Note
No deposition occurs at the substrate temperature of 150° C.
Average wiring life is time to wire breaking when current is passed at a current density of $1 \times 10^6$ A/cm$^2$ through a cross-sectional area of 1 μm$^2$ at 250° C.
Spike generation ratio is destruction probability at the junction portion of 0.15 μm depth.

TABLE 2

| Evaluation means | Substrate temperature Ts | | | | |
|---|---|---|---|---|---|
| | 150° C. | 160° C. | 200° C. 250° C. 270° C. 300° C. 330° C. 350° C. 370° C. 400° C. | 430° C. | 450° C. | 470° C. |
| Carbon Content | Not deposited | ← | Lower than detection limit | → | several % contained |
| Resistivity | — | ← | 3~6 μΩcm | | → |
| Reflectance | — | ← | 80~90% | → ← 65~80% → ← | 60% or lower → |
| Average wiring life | — | ← | 10$^3$~5 × 10$^4$ hrs. | → ← | ~10$^3$ hrs. → |
| Deposition speed | — | several Å/min. → ← | 100~800 Å/min. | → ← | 1000 Å/min. |
| Hillock density | — | ← 0~10$^3$ cm$^{-2}$ → ← | 0~10 cm$^{-2}$ | → ← | 0~10$^4$ cm$^{-2}$ → |
| Spike generation ratio | — | ← 0~15% → ← | ~0% | → ← | 0~35% → |

Note
No deposition occurs at the substrate temperature of 150° C.
Average wiring life is time to wire breaking when current is passed at a current density of $1 \times 10^6$ A/cm$^2$ through a cross-sectional area of 1 μm$^2$ at 250° C.
Spike generation ratio is destruction probability at the junction portion of 0.15 μm depth.

TABLE 3

| | Single crystalline Si | Poly-crystalline Si | Amorphous Si | W | Mo | Ta | WSi | TiSi |
|---|---|---|---|---|---|---|---|---|
| T-SiO$_2$ | 2-1 | | | | | | | |
| SiO$_2$ | 2-2 | 2-12 | 2-22 | 2-32 | 2-42 | 2-52 | 2-62 | 2-72 |
| BSG | 2-3 | 2-13 | 2-23 | 2-33 | 2-43 | 2-53 | 2-63 | 2-73 |
| PSG | 2-4 | 2-14 | 2-24 | 2-34 | 2-44 | 2-54 | 2-64 | 2-74 |
| BPSG | 2-5 | 2-15 | 2-25 | 2-35 | 2-45 | 2-55 | 2-65 | 2-75 |
| P—SiN | 2-6 | 2-16 | 2-26 | 2-36 | 2-46 | 2-56 | 2-66 | 2-76 |
| T-SiN | 2-7 | 2-17 | 2-27 | 2-37 | 2-47 | 2-57 | 2-67 | 2-77 |
| LP-SiN | 2-8 | 2-18 | 2-28 | 2-38 | 2-48 | 2-58 | 2-68 | 2-78 |
| ECR-SiN | 2-9 | 2-19 | 2-29 | 2-39 | 2-49 | 2-59 | 2-69 | 2-79 |

| | Al | AlSi | AlTi | Ti—N | Cu | Al—Si—Cu | AlPd | Ti | Mo—Si | Ta—Si |
|---|---|---|---|---|---|---|---|---|---|---|
| T-SiO$_2$ | | | | | | | | | | |
| SiO$_2$ | 2-82 | 2-92 | 2-102 | 2-112 | 2-122 | 2-132 | 2-142 | 2-152 | 2-162 | 2-172 |
| BSG | 2-83 | 2-93 | 2-103 | 2-113 | 2-123 | 2-133 | 2-143 | 2-153 | 2-163 | 2-173 |
| PSG | 2-84 | 2-94 | 2-104 | 2-114 | 2-124 | 2-134 | 2-144 | 2-154 | 2-164 | 2-174 |
| BPSG | 2-85 | 2-95 | 2-105 | 2-115 | 2-125 | 2-135 | 2-145 | 2-155 | 2-165 | 2-175 |
| P—SiN | 2-86 | 2-96 | 2-106 | 2-116 | 2-126 | 2-136 | 2-146 | 2-156 | 2-166 | 2-176 |
| T-SiN | 2-87 | 2-97 | 2-107 | 2-117 | 2-127 | 2-137 | 2-147 | 2-157 | 2-167 | 2-177 |
| LP-SiN | 2-88 | 2-98 | 2-108 | 2-118 | 2-128 | 2-138 | 2-148 | 2-158 | 2-168 | 2-178 |
| ECR-SiN | 2-89 | 2-99 | 2-109 | 2-119 | 2-129 | 2-139 | 2-149 | 2-159 | 2-169 | 2-179 |

(Note) Numeral indicates Sample No.

TABLE 4

| | Single crystalline Si | Poly-crystalline Si | Amorphous Si | W | Mo | Ta | WSi | TiSi |
|---|---|---|---|---|---|---|---|---|
| T-SiO$_2$ | 1-1 | 1-11 | | | | | | |
| SiO$_2$ | 1-2 | 1-12 | 1-22 | 1-32 | 1-42 | 1-52 | 1-62 | 1-72 |

TABLE 4-continued

| | | | | | | | |
|---|---|---|---|---|---|---|---|
| BSG | 1-3 | 1-13 | 1-23 | 1-33 | 1-43 | 1-53 | 1-63 | 1-73 |
| PSG | 1-4 | 1-14 | 1-24 | 1-34 | 1-44 | 1-54 | 1-64 | 1-74 |
| BPSG | 1-5 | 1-15 | 1-25 | 1-35 | 1-45 | 1-55 | 1-65 | 1-75 |
| P—SiN | 1-6 | 1-16 | 1-26 | 1-36 | 1-46 | 1-56 | 1-66 | 1-76 |
| T-SiN | 1-7 | 1-17 | 1-27 | 1-37 | 1-47 | 1-57 | 1-67 | 1-77 |
| LP-SiN | 1-8 | 1-18 | 1-28 | 1-38 | 1-48 | 1-58 | 1-68 | 1-78 |
| ECR-SiN | 1-9 | 1-19 | 1-29 | 1-39 | 1-49 | 1-59 | 1-69 | 1-79 |

| | Al | AlSi | AlTi | Ti—N | Cu | Al—Si—Cu | AlPd | Ti | Mo—Si | Ta—Si |
|---|---|---|---|---|---|---|---|---|---|---|
| T-SiO$_2$ | | | | | | | | | | |
| SiO$_2$ | 1-82 | 1-92 | 1-102 | 1-112 | 1-122 | 1-132 | 1-142 | 1-152 | 1-162 | 1-172 |
| BSG | 1-83 | 1-93 | 1-103 | 1-113 | 1-123 | 1-133 | 1-143 | 1-153 | 1-163 | 1-173 |
| PSG | 1-84 | 1-94 | 1-104 | 1-114 | 1-124 | 1-134 | 1-144 | 1-154 | 1-164 | 1-174 |
| BPSG | 1-85 | 1-95 | 1-105 | 1-115 | 1-125 | 1-135 | 1-145 | 1-155 | 1-165 | 1-175 |
| P—SiN | 1-86 | 1-96 | 1-106 | 1-116 | 1-126 | 1-136 | 1-146 | 1-156 | 1-166 | 1-176 |
| T-SiN | 1-87 | 1-97 | 1-107 | 1-117 | 1-127 | 1-137 | 1-147 | 1-157 | 1-167 | 1-177 |
| LP-SiN | 1-88 | 1-98 | 1-108 | 1-118 | 1-128 | 1-138 | 1-148 | 1-158 | 1-168 | 1-178 |
| ECR-SiN | 1-89 | 1-99 | 1-109 | 1-119 | 1-129 | 1-139 | 1-149 | 1-159 | 1-169 | 1-179 |

(note) Numeral indicates Sample No.

TABLE 5

| | Substrate temperature (°C.) | | | | | |
|---|---|---|---|---|---|---|
| | 220° C. | 250° C. | 300° C. | 350° C. | 400° C. | 450° C. |
| Width of wiring (μm) | 4 | 4 | 2  4  6 | 4 | 4 | 4 |
| Resistivity (Ωcm) | 3.0~3.3 | ← | 2.7~3.0 | → 3.0~3.3 | → | |
| Hillock density (cm$^{-2}$) | ← 10~100 → | ← | 0~100 | → | ← 10~100 → | |
| Average wiring life (hrs.) | 2 × 10$^3$ | 2~4 × 10$^3$ | 1~3 × 10$^3$  2~4 × 10$^3$  4 × 10$^3$ or longer | 2~4 × 10$^3$ | 2~4 × 10$^3$ | 2 × 10$^3$ |
| Deposition speed Å/min. | ← 400~500 → | ← | 600~800 | → | ← 600~1000 → | |

Note:
Average wiring life is time to wire breaking when current is passed at a current density of 1 × 10$^5$ A/cm$^2$ through a cross-sectional area of 1 μm$^2$ at 200° C.

TABLE 6

| | Substrate temperature (°C.) | | | | | |
|---|---|---|---|---|---|---|
| | 220° C. | 250° C. | 300° C. | 350° C. | 400° C. | 450° C. |
| Width of wiring (μm) | 4 | 4 | 2  4  6 | 4 | 4 | 4 |
| Resistivity (Ωcm) | 3.0~3.3 | ← | 2.7~3.0 | → 3.0~3.3 | ← → | |
| Hillock density (cm$^{-2}$) | ← 10~100 → | ← | 0~100 | → | ← 10~100 → | |
| Average wiring life (hrs.) | 2 × 10$^3$ | 2~4 × 10$^3$ | 1~3 × 10$^3$  2~4 × 10$^3$  4 × 10$^3$ or longer | 2~4 × 10$^3$ | 2~4 × 10$^3$ | 2 × 10$^3$ |
| Deposition speed Å/min. | ← 400~500 → | ← | 600~800 | → | ← 600~1000 → | |

Note:
Average wiring life is time to wire breaking when current is passed at a current density of 1 × 10$^5$ A/cm$^2$ through a cross-sectional area of 1 μm$^2$ at 200° C.

We claim:

1. A process for forming a deposited film comprising the steps of:
   (a) providing a substrate having an electron donative surface in a space for formation of the deposited film;
   (b) introducing a gas of an alkyl aluminum hydride, a gas containing titanium atoms and hydrogen gas into said space for formation of deposited film; and
   (c) maintaining the temperature of said electron donative surface within the range of from the decomposition temperature of said alkyl aluminum hydride to 450° C. to form a deposited film comprising aluminum and titanium on said electron donative surface.

2. The process according to claim 1, wherein said alkyl aluminum hydride is dimethyl aluminum hydride.

3. The process according to claim 1, wherein said alkyl aluminum hydride is monomethyl aluminum hydride.

4. The process according to claim 1, wherein said gas containing titanium is TiCl$_4$.

5. A process for forming a deposited film comprising the steps of:
   (a) providing a substrate having an electron donative surface in a space for formation of the deposited film;
   (b) introducing a gas of an alkyl aluminum hydride, a gas containing silicon atoms, a gas containing titanium atoms and hydrogen gas into said space for formation of deposited film; and
   (c) maintaining the temperature of said electron donative surface within the range of from the decomposition temperature of said alkyl aluminum hydride to 450° C. to form a deposited film comprising aluminum, silicon and titanium on said electron donative surface.

6. The process according to claim 5, wherein said alkyl aluminum hydride is dimethyl aluminum hydride.

7. The process according to claim 5, wherein said alkyl hydride is monomethyl aluminum hydride.

8. The process according to claim 5, wherein said gas containing titanium is $TiCl_4$.

9. A process for forming a deposited film comprising the steps of:
(a) providing a substrate having an electron donative surface (A) and an electron non-donative surface (B) in a space for formation of the deposited film;
(b) introducing a gas of an alkyl aluminum hydride, a gas containing titanium atoms and hydrogen gas into said space for formation of deposited film; and
(c) maintaining the temperature of said electron donative surface (A) within the range of from the decomposition temperature of said alkyl aluminum hydride to 450° C. to form a deposited film comprising aluminum and titanium on said electron donative surface (A).

10. The process according to claim 9, wherein said alkyl aluminum hydride is dimethyl aluminum hydride.

11. The process according to claim 9, wherein said alkyl aluminum hydride is monomethyl aluminum hydride.

12. The process according to claim 9, wherein said gas containing titanium is $TiCl_4$.

13. A process for forming a deposited film comprising the steps of:
(a) providing a substrate having an electron donative surface (A) and an electron non-donative surface (B) in a space for formation of the deposited film;
(b) introducing a gas of an alkyl aluminum hydride, a gas containing titanium atoms, a gas containing silicon atoms and hydrogen gas into said space for formation of deposited film; and
(c) maintaining the temperature of said electron donative surface (A) within the range of from the decomposition temperature of said alkyl aluminum hydride to 450° C. to form a deposited film comprising aluminum and titanium on said electron donative surface.

14. The process according to claim 13, wherein said alkyl aluminum hydride is dimethyl aluminum hydride.

15. The process according to claim 13, wherein said alkyl aluminum hydride is monomethyl aluminum hydride.

16. The process according to claim 13, wherein said gas containing titanium is $TiCl_4$.

17. A process for forming a deposited film comprising the steps of:
(a) providing a substrate having an electron donative surface in a space for formation of the deposited film;
(b) introducing a gas of an alkyl aluminum hydride, a gas containing copper atoms and hydrogen gas into said space for formation of deposited film; and
(c) maintaining the temperature of said electron donative surface within the range of from the decomposition temperature of said alkyl aluminum hydride to 450° C. to form a deposited film comprising aluminum and copper on said electron donative surface.

18. A process for forming a deposited film comprising the steps of:
(a) providing a substrate having an electron donative surface in a space for formation of the deposited film;
(b) introducing a gas of an alkyl aluminum hydride, a gas containing silicon atoms, a gas containing copper atoms and hydrogen gas into said space for formation of deposited film; and
(c) maintaining the temperature of said electron donative surface within the range of from the decomposition temperature of said alkyl aluminum hydride to 450° C. to form a deposited film comprising aluminum, silicon and copper on said electron donative surface.

19. The process according to claim 17 or 18, wherein said alkyl aluminum hydride is dimethyl aluminum hydride.

20. The process according to claim 17 or 18, wherein said alkyl aluminum hydride is monomethyl aluminum hydride.

21. A process for forming a deposited film comprising the steps of:
(a) providing a substrate having an electron donative surface (A) and an electron non-donative surface (B) in a space for formation of the deposited film;
(b) introducing a gas of an alkyl aluminum hydride, a gas containing copper atoms and hydrogen gas into said space for formation of deposited film; and
(c) maintaining the temperature of said electron donative surface (A) within the range of from the decomposition temperature of said alkyl aluminum hydride to 450° C. to form a deposited film comprising aluminum and copper on said electron donative surface (A).

22. The process according to any one of claims 1, 5, 17 and 18, wherein said substrate is constituted of a material selected from single monocrystalline silicon, polycrystalline silicon and amorphous silicon.

23. The process according to any one of claims 1, 5, 17 and 18, wherein said substrate is a III-V compound semiconductor containing an element belonging to the group III of the periodic table and an element belonging to the group V of the periodic table.

24. The process according to anyone of claims 1, 5, 17 and 18, wherein said substrate is a II-VI compound semiconductor containing an element belonging to the group II of the periodic table and an element belonging to the group VI of the periodic table.

25. The process according to any one of claims 1, 5, 17 and 18, wherein said substrate is a metal containing at least one element selected from tungsten, molybdenum, tantalum, aluminum, titanium and copper.

26. The process according to any one of claims 1, 5, 17 and 18, wherein said substrate is a metal.

27. The process according to any one of claims 1, 5, 17 and 18, wherein said substrate is a semiconductor.

28. The process according to any one of claims 1, 5, 17 and 18, wherein said substrate is silicide.

29. A process for forming a deposited film comprising the steps of:
(a) providing a substrate having an electron donative surface (A) and an electron non-donative surface (B) in a space for formation of the deposited film;
(b) introducing a gas of an alkyl aluminum hydride, a gas containing silicon atoms, a gas containing copper atoms and hydrogen gas into said space for formation of deposited film; and
(c) maintaining the temperature of said electron donative surface (A) within the range of from the decomposition temperature of said alkyl aluminum hydride to 450° C. to form a deposited film comprising aluminum, silicon and copper on said electron donative surface (A).

30. The process according to claim 21 or 29, wherein said alkyl aluminum hydride is dimethyl aluminum hydride.

31. The process according to claim 21 or 29, wherein said alkyl aluminum hydride is monomethyl aluminum hydride.

32. The process according to any one of claims 9, 13, 21 and 29, wherein said electron donative surface (A) is formed of a material selected from monocrystalline silicon, polycrystalline silicon and amorphous silicon, and said electron non-donative surface (B) is formed of an insulating material.

33. The process according to any one of claims 9, 13, 21 and 29, wherein said electron donative surface (A) is formed of a III-V group compound semiconductor containing an element belonging to the group III of the periodic table and an element belonging to the group V of the periodic table, and said electron non-donative surface (B) is formed of an insulating material.

34. The process according to any one of claims 9, 13, 21, and 29, wherein said electron donative surface (A) is formed of a II-VI group compound semiconductor containing an element belonging to the group II of the periodic table and an element belonging to the group VI of the periodic table, and said electron non-donative surface (B) is formed of an insulating material.

35. The process according to any one of claims 9, 13, 21 and 29, wherein said electron donative surface (A) is formed of a metal containing at least one element selected from tungsten, molybdenum, tantalum, aluminum, titanium and copper, and said electron non-donative surface (B) is formed of an insulating material.

36. The process according to any one of claims 9, 13, 21 and 29, wherein said electron donative surface (A) is formed of a metal and said electron non-donative surface (B) is formed of an insulating material.

37. The process according to any one of claims 9, 13, 21 and 29, wherein said electron donative surface (A) is formed of a semiconductor and said electron non-donative surface (B) is formed of an insulating material.

38. The process according to any one of claims 9, 13, 21 and 29, wherein said electron donative surface (A) is formed of silicide and said electron non-donative surface (B) is formed of an insulating material.

39. A process for preparing a semiconductor device comprising the steps of:
forming an insulating film on a semiconductor substrate;
forming on said insulating film an opening through which the surface of said semiconductor substrate is exposed; and
applying chemical vapor deposition method by use of an alkyl aluminum hydride, a gas containing titanium atoms and hydrogen to form a deposited film comprising aluminum and titanium selectively in said opening.

40. The process according to claim 39, wherein said alkyl aluminum hydride comprises a methyl group.

41. The process according to claim 40, wherein said alkyl aluminum hydride is dimethyl aluminum hydride.

42. A process for preparing a semiconductor device comprising the steps of:
forming an insulating film on a semiconductor substrate;
forming on said insulating film an opening through which the surface of said semiconductor substrate is exposed; and
applying chemical vapor deposition method by use of an alkyl aluminum hydride, a gas containing copper atoms and hydrogen atoms to form a deposited film comprising aluminum and copper selectively in said opening.

43. The process according to claim 42, wherein said alkyl aluminum hydride comprises a methyl group.

44. The process according to claim 43, wherein said alkyl aluminum hydride is dimethyl aluminum hydride.

45. A process for forming a metal film comprising the steps of:
providing a substrate; and
depositing a metal film comprising aluminum and titanium on said substrate by chemical vapor deposition using alkyl aluminum hydride and a gas containing a titanium atom.

46. A process for forming a metal film comprising the steps of:
providing a substrate; and
depositing a metal film comprising aluminum and copper on said substrate by chemical vapor deposition using alkyl aluminum hydride and a gas containing a copper atom.

47. A process for forming a metal film comprising the steps of:
providing a substrate; and
depositing a metal film comprising aluminum, titanium and silicon on said substrate by chemical vapor deposition using alkyl aluminum hydride and a gas containing a titanium atom and a gas containing a silicon atom.

48. A process for forming a metal film comprising the steps of:
providing a substrate; and
depositing a metal film comprising aluminum, copper and silicon on said substrate by chemical vapor deposition using alkyl aluminum hydride, a gas containing a copper atom and a gas containing a silicon atom.

* * * * *

UNITED STATES PATENT AND TRADEMARK OFFICE
CERTIFICATE OF CORRECTION

PATENT NO. : 5,154,949

DATED : October 13, 1992

INVENTOR(S) : HITOSHI SHINDO, ET AL.

It is certified that error appears in the above-identified patent and that said Letters Patent is hereby corrected as shown below:

On the title page, Item

[63] RELATED U.S. APPLICATION DATA

"Continuation-in-part" should read --Continuation--.

COLUMN 1

Line 7, "continuation-in-part" should read --continuation--.
Line 35, "can not" should read --cannot--.

COLUMN 2

Line 46, "can not" should read --cannot--.

COLUMN 3

Line 35, "TBA" should read --TIBA--.
Line 61, "about" should be deleted.

COLUMN 4

Line 7, "performances, there" should read --performance, there have--.
Line 20, "no" should be deleted.
Line 55, "a" should read --an--.

COLUMN 6

Line 20, "o" should read --of--.

COLUMN 7

Line 13, "a" should read --an--.

UNITED STATES PATENT AND TRADEMARK OFFICE
CERTIFICATE OF CORRECTION

PATENT NO. : 5,154,949

DATED : October 13, 1992

INVENTOR(S) : HITOSHI SHINDO, ET AL.

It is certified that error appears in the above-identified patent and that said Letters Patent is hereby corrected as shown below:

COLUMN 12

Line 2, "are" should read --is--.
Line 18, "are" should read --is--.
Line 19, "H2" should read --$H_2$--.
Line 45, "10-4 to 10-3" should read --$10^{-4}$ to $10^{-3}$--.
Line 64, "$Cu(C_2H_7O_2)_2$" should read --$Cu(C_5H_7O_2)_2$--.

COLUMN 14

Line 7, "TiCl4" should read --$TiCl_4$--.

COLUMN 15

Line 17, "$10^{-4}-10^6/cm^2$" should read --$10^4-10^6/cm^2$--.

COLUMN 17

Line 27, "when" should read --with--.
Line 29, "is" should read --are--.

COLUMN 18

Line 17, "when" should read --with--.
Line 18, "gase," should read --gases,--.
Line 19, "is" should read --are--.

COLUMN 22

Line 67, "were" should read --was--.

UNITED STATES PATENT AND TRADEMARK OFFICE
CERTIFICATE OF CORRECTION

PATENT NO. : 5,154,949

DATED : October 13, 1992

INVENTOR(S) : HITOSHI SHINDO, ET AL.

It is certified that error appears in the above-identified patent and that said Letters Patent is hereby corrected as shown below:

COLUMN 23

Line 13, "were" should read --was--.
Line 19, "be Si to" should be deleted.

COLUMN 26

Line 27, "Sample" should read --Samples--.

COLUMN 28

Line 55, "badge." should read --batch.--.
Line 64, "donative." should read --donative--.

COLUMN 31

Line 42, "were" should read --was--.
Line 48, "be Si to" should be deleted.

COLUMN 35

Line 5, "were" should read --was--.
Line 11, "to be Si" should be deleted.

COLUMN 37

Line 20, "of" should be deleted.
Line 28, "cipher" should read --ciphers--.
Line 30, "cipher" should read --ciphers--.

UNITED STATES PATENT AND TRADEMARK OFFICE
CERTIFICATE OF CORRECTION

PATENT NO. : 5,154,949

DATED : October 13, 1992

INVENTOR(S) : HITOSHI SHINDO, ET AL.

It is certified that error appears in the above-identified patent and that said Letters Patent is hereby corrected as shown below:

<u>COLUMN 38</u>

Line 23, "Al" should read --Al is--.

<u>COLUMN 43</u>

Line 6, "alkyl" should read --alkyl aluminum--.

<u>COLUMN 44</u>

Line 43, "anyone" should read --any one--.

Signed and Sealed this

First Day of March, 1994

Attest:

BRUCE LEHMAN

*Attesting Officer*   *Commissioner of Patents and Trademarks*